US012721009B2

(12) United States Patent
Jeong et al.

(10) Patent No.: US 12,721,009 B2
(45) Date of Patent: Aug. 25, 2026

(54) DISPLAY DEVICE AND METHOD FOR MANUFACTURING THE SAME

(71) Applicant: Samsung Display Co., Ltd., Yongin-si (KR)

(72) Inventors: Chul Ho Jeong, Yongin-si (KR); Sungguk An, Yongin-si (KR); Jang Doo Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 353 days.

(21) Appl. No.: 18/515,571

(22) Filed: Nov. 21, 2023

(65) Prior Publication Data

US 2024/0237494 A1 Jul. 11, 2024

(30) Foreign Application Priority Data

Jan. 9, 2023 (KR) ........................ 10-2023-0003118

(51) Int. Cl.
*H10K 59/00* (2023.01)
*H04M 1/02* (2006.01)
*H10K 59/80* (2023.01)
*H10K 71/12* (2023.01)
*H10K 102/00* (2023.01)

(52) U.S. Cl.
CPC ........ *H10K 59/873* (2023.02); *H04M 1/0216* (2013.01); *H10K 59/8792* (2023.02); *H10K 71/12* (2023.02); *H10K 2102/311* (2023.02)

(58) Field of Classification Search
CPC .. H10K 59/873; H10K 59/871; H10K 59/872; H10K 59/8791; H10K 59/8792; H10K 59/1201
See application file for complete search history.

(56) References Cited

U.S. PATENT DOCUMENTS

2020/0324375 A1* 10/2020 Oh ........................ B23K 26/382
2021/0016461 A1* 1/2021 Kwon ..................... B26D 1/045
2022/0181592 A1* 6/2022 Jeong ...................... G09F 9/301

FOREIGN PATENT DOCUMENTS

KR 10-1494289 2/2015

OTHER PUBLICATIONS

Seungbo Ryu et al., "High-temperature Operation of PEMFC Using Pore-filling PTFE/Nafion Composite Membrane Treated with Electric Field", International Journal of Energy Research, 2021, pp. 1-11, Wiley, DOI: 10.1002/er.7017 (Total 11 pages).

* cited by examiner

*Primary Examiner* — Reema Patel
(74) *Attorney, Agent, or Firm* — Sughrue Mion, PLLC

(57) ABSTRACT

A display device includes a display panel and a protection layer disposed on the display panel. The protection layer includes a base layer having a porous structure and a polymer resin that is impregnated into the base layer. The porous structure of the base layer includes a plurality of pores.

19 Claims, 16 Drawing Sheets

AA'
DP-DA
DP-TA
PA
BT BLL
DP-TA
PX2-B PX2-G PX2-R
PX2
LA
LA
PX1-B
PX1-R
PX1-G
PX1
NLA
DP-DA
DR1
DR2
DR3

DM

LD

310-OP AE EL CE PDL-OP 330
320
310
240
230
220
210
TFE3
TFE2
TFE1
PDL
IL8
IL7
IL6
IL5
IL4
IL3
IL2
IL1
BFL
BL

ARL
IS
TFE
DP-EL
DP-CL
DP

CNE2
CNE1
BML2-C SP2
PC
SP1

DE2 GT2 AC2 SE2 BMLb BMLa DE1 AC1 GT1 SE1 CE10 CE20

O-TFT S-TFT Cst

DD
WM
UM
DM
LM
BP
IMA
AL1
UTG
AL-U
DL
AL2
PPL
AL4-1
PLT-1
AL8
AL5-1
DTM-1
MML-1
AL6-1
ML1
AL7-1
AA1
NFA10
FA0
NFA20
BA
AA2
II'
MSM3 MSM1
LTH
PP1
GP
SCV
PP2
MSM2
AL3-1
PPL-1
AL4-2
PLT-2
PLT-F
OP
AL5-2
DTM-2
MML-2
AL6-2
ML2
AL7-2
DIC
FCB
AL3-2
PPL-2
II
AL3-1
AL3-2
AL3
DTM-1
DTM-2
DTM
ML1
ML2
ML
AL4-1
AL4-2
AL4
PLT-1
PLT-2
PLT-F
PLT
AL5-1
AL5-2
AL5
PP1
PP2
PP
AL6-1
AL6-2
AL6
AL7-1
AL7-2
AL7
MSM1
MSM2
MSM3
MSM
DR3
DR2
DR1

DD
WM
UM
LM
BP
IMA
AL1
UTG
AL-U
DL
AL2
DM
AL3
PPL
AL4
PLT
AL5
DTM
MML
AL6
ML
AL7
PP
AL9
AA1
AA2
AL3-1
PPL-1
PPL-2
AL3-2
BPL
BA

DISPLAY DEVICE AND METHOD FOR MANUFACTURING THE SAME

CROSS-REFERENCE TO RELATED APPLICATION(S)

This application claims priority to and benefits of Korean Patent Application No. 10-2023-0003118 under 35 U.S.C. § 119, filed on Jan. 9, 2023, the entire contents of which are incorporated herein by reference.

BACKGROUND

1. Technical Field

Embodiments relate to a display device and a method for manufacturing the display device, and more particularly, to a foldable display device and a method for manufacturing the foldable display device.

2. Description of the Related Art

A display device includes a display area that is activated according to an electrical signal. The display device may detect an input applied from the outside through the display area, and simultaneously, may display various images to provide information to a user. Recently, as display devices having various shapes are developed, a display area having various shapes has been implemented.

SUMMARY

Embodiments provide a display device having excellent mechanical durability and improved folding characteristics, and a method for manufacturing the display device.

However, embodiments of the disclosure are not limited to those set forth herein. The above and other embodiments will become more apparent to one of ordinary skill in the art to which the disclosure pertains by referencing the detailed description of the disclosure given below.

In an embodiment, a display device may include: a display panel; and a protection layer disposed on the display panel, wherein the protection layer may include: a base layer having a porous structure; and a polymer resin impregnated into the base layer.

In an embodiment, the polymer resin may include at least one of nafion, flemion, and aciplex.

In an embodiment, the base layer may include at least one of glass fibers, polypropylene, polyethylene, and polytetrafluoroethylene.

In an embodiment, the base layer may include a plurality of pores, and the polymer resin may be impregnated into at least a portion of the plurality of pores.

In an embodiment, the protection layer may have a thickness in a range of about 10 μm to about 150 μm.

In an embodiment, the display device may further include a window on the display panel, wherein the protection layer may be disposed on at least one of an upper portion of the window or between the display panel and the window.

In an embodiment, the protection layer may be disposed on the window, and the display device may further include a first adhesive layer disposed between the protection layer and the window.

In an embodiment, the display device may further include an additional protection layer disposed between the window and the display panel.

In an embodiment, the display device may further include an antireflection layer disposed between the display panel and the protection layer.

In an embodiment, the display device may further include a second adhesive layer disposed between the antireflection layer and the protection layer, wherein the second adhesive layer may be directly disposed on the antireflection layer, and the protection layer may be directly disposed on the second adhesive layer.

In an embodiment, the protection layer may further include a coating layer disposed on a surface of the base layer and including a polymer resin.

In an embodiment, the base layer may include a lower surface adjacent to the display panel and an upper surface facing the lower surface, and the coating layer may include: a first coating layer disposed on the lower surface of the protection layer; and a second coating layer disposed on the upper surface of the protection layer.

In an embodiment, the first coating layer may have a thickness less than a thickness of the second coating layer.

In an embodiment, the protection layer may have light transmittance of about 90% or more.

In an embodiment, a content of the polymer resin relative to the entire protective layer may be in a range of about 1 wt % to about 50 wt %.

In an embodiment, the display device may further include at least one folding area that is folded with respect to a folding axis extending in a direction.

In an embodiment, the protection layer may further include a functional layer formed of at least one of a hard coating material and an anti-fingerprint material.

In an embodiment, a display device may include: a display panel including a first non-folding area, a second non-folding area, and a folding area disposed between the first non-folding area and the second non-folding area; and a protection layer disposed on the display panel, wherein the protection layer may include: a base layer including a polymer material; and a polymer resin.

In an embodiment, a method for manufacturing a display device may include: forming a display panel; and forming a protection layer, wherein the protection layer may be disposed on the display panel, and the forming of the protection layer may include: preparing a polymer solution including a polymer resin; and immersing a base layer having a porous structure into the polymer solution to impregnate the polymer resin into the base layer.

In an embodiment, in the impregnating of the polymer resin into the base layer, a first coating layer disposed on a surface of the base layer and a second coating layer disposed on another surface of the base layer may be formed.

BRIEF DESCRIPTION OF THE DRAWINGS

The accompanying drawings are included to provide a further understanding of the invention, and are incorporated in and constitute a part of the description. The drawings illustrate embodiments and, together with the description, serve to explain principles of the invention. In the drawings.

DETAILED DESCRIPTION OF THE EMBODIMENTS

Figure 1A:
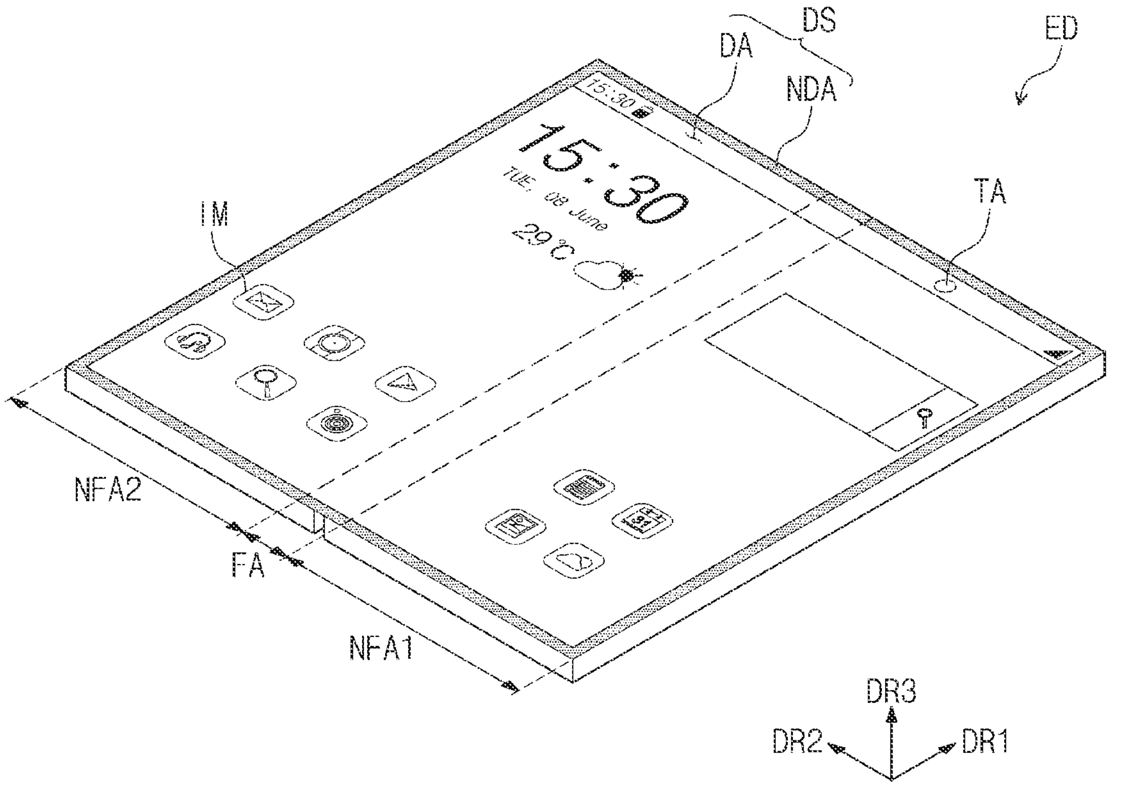
FIGS. 1A, 1B, and 1C are schematic perspective views of an electronic apparatus according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

Hereinafter, embodiments will be described with reference to the accompanying drawings.

Figure 1B:
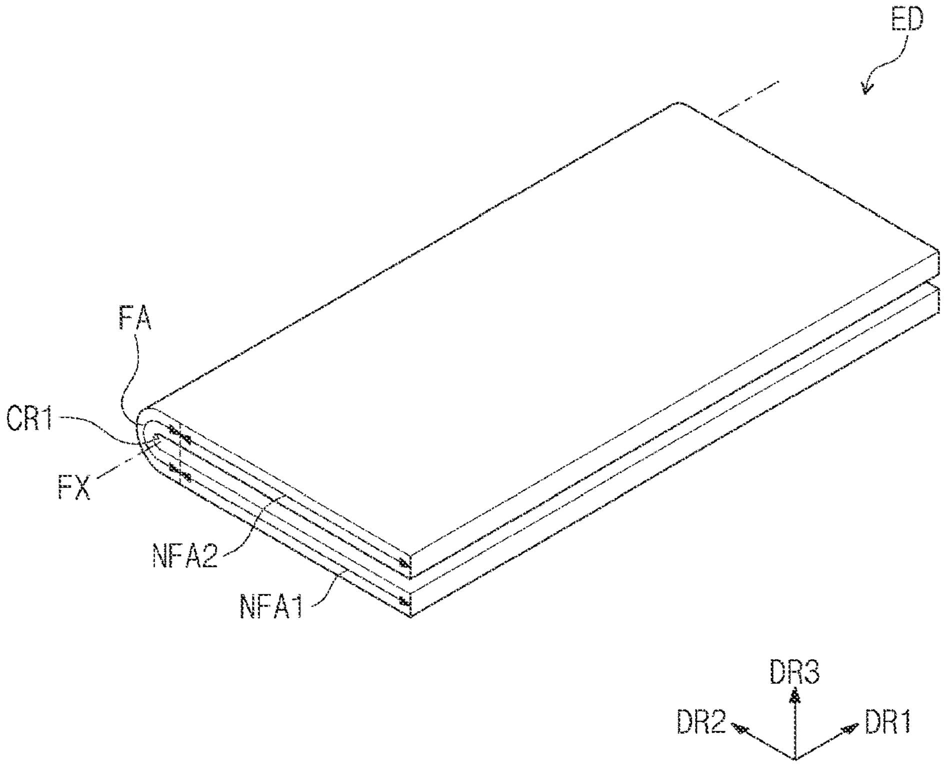
Figure 1C:
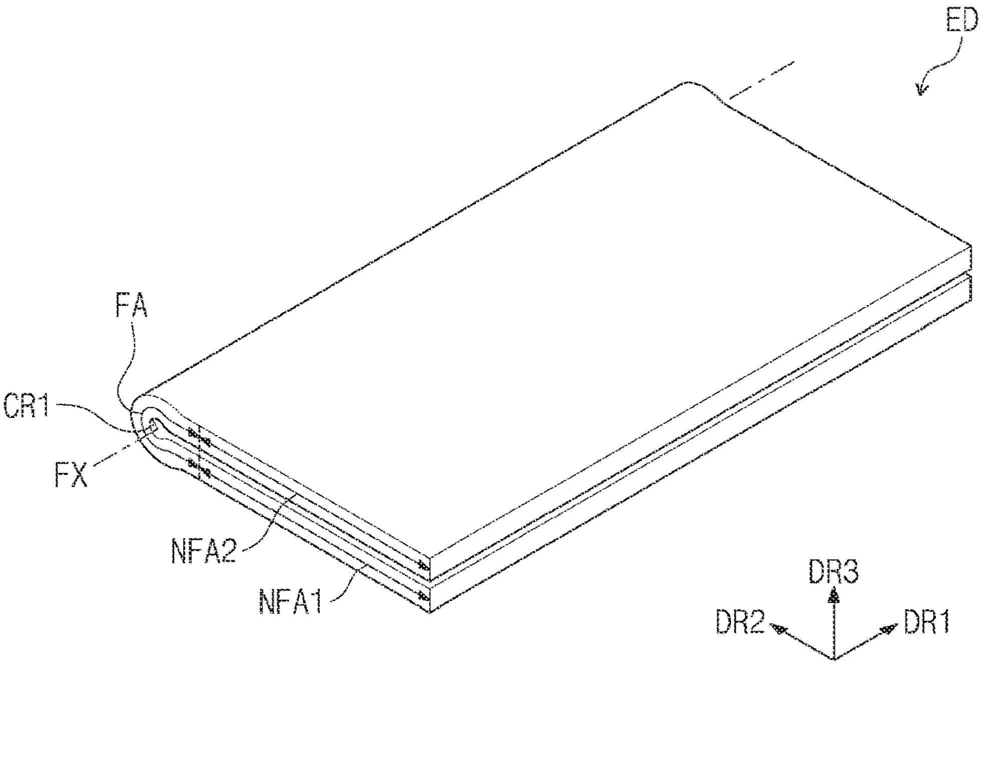

FIGS. 1A, 1B, and 1C are schematic perspective views of an electronic apparatus according to an embodiment. FIG. 1A illustrates an unfolded state, and FIGS. 1B and 1C illustrate a folded state.

Referring to FIGS. 1A to 1C, an electronic apparatus ED according to an embodiment may include a display surface DS defined by a first direction DR1 and a second direction DR2 intersecting the first direction DR1. The electronic apparatus ED may provide an image IM to a user through the display surface DS.

The display surface DS may include a display area DA and a non-display area NDA around the display area DA. The display area DA may display the image IM, and the non-display area NDA may not display the image IM. The non-display area NDA may surround the display area DA. However, embodiments are not limited thereto, and a shape of the display area DA and a shape of the non-display area NDA may be changed.

The display surface DS may include a sensing area TA. The sensing area TA may be a partial area of the display area DA. The sensing area TA may have transmittance greater than that of each of other areas of the display area DA. Hereinafter, other areas of the display area DA except for the sensing area TA may be defined as a general display area.

An optical signal, for example, visible light or infrared light may move to the sensing area TA. The electronic apparatus ED may photograph an external image through the visible light passing through the sensing area TA or determine accessibility of an external object through the infrared light. Although one sensing area TA is illustrated as an example in FIG. 1A, embodiments are not limited thereto, and sensing areas TA may be provided.

Hereinafter, a direction that substantially perpendicularly crosses a plane defined by the first direction DR1 and the second direction DR2 is defined as a third direction DR3. The third direction DR3 may be a reference for distinguishing front and rear surfaces of each of members from each other. In the description, the term "on the plane" may be defined as a state when viewed in the third direction DR3. Hereinafter, the first to third directions DR1, DR2, and DR3 may be directions indicated by first to third directional axes and designated by the same reference numerals, respectively.

The electronic apparatus ED may include a folding area FA and non-folding areas NFA1 and NFA2. The non-folding areas NFA1 and NFA2 may include a first non-folding area NFA1 and a second non-folding area NFA2. In the second direction DR2, the folding area FA may be disposed between the first non-folding area NFA1 and the second non-folding area NFA2.

As illustrated in FIG. 1B, the folding area FA may be folded based on a folding axis FX parallel to the first direction DR1. The folding area FA may have a certain curvature and a curvature radius. The first non-folding area NFA1 and the second non-folding area NFA2 may face each other, and the electronic apparatus ED may be inner-folded so that the display surface DS may not be exposed to the outside.

In an embodiment, the display device DD may be outer-folded so that the display surface DS may be exposed to the outside. According to an embodiment, the electronic apparatus ED may repeatedly perform an inner-folding operation or an outer-folding operation from an unfolding operation, but embodiments are not limited thereto. In an embodiment, the electronic apparatus ED may select any one of the unfolding operation, the inner-folding operation, and the outer-folding operation.

As illustrated in FIG. 1B, a distance between the first non-folding area NFA1 and the second non-folding area NFA2 may be substantially equal to a curvature radius CR1, but as illustrated in FIG. 1C, a distance between the first non-folding area NFA1 and the second non-folding area NFA2 may be less than the curvature radius CR1. FIGS. 1B and 1C are schematic views based on the display surface DS, and a housing HM (see FIG. 2A) defining an outer appearance of the electronic apparatus ED may be in contact with end areas of a first non-folding area NFA1 and a second non-folding area NFA2.

Figure 2A:
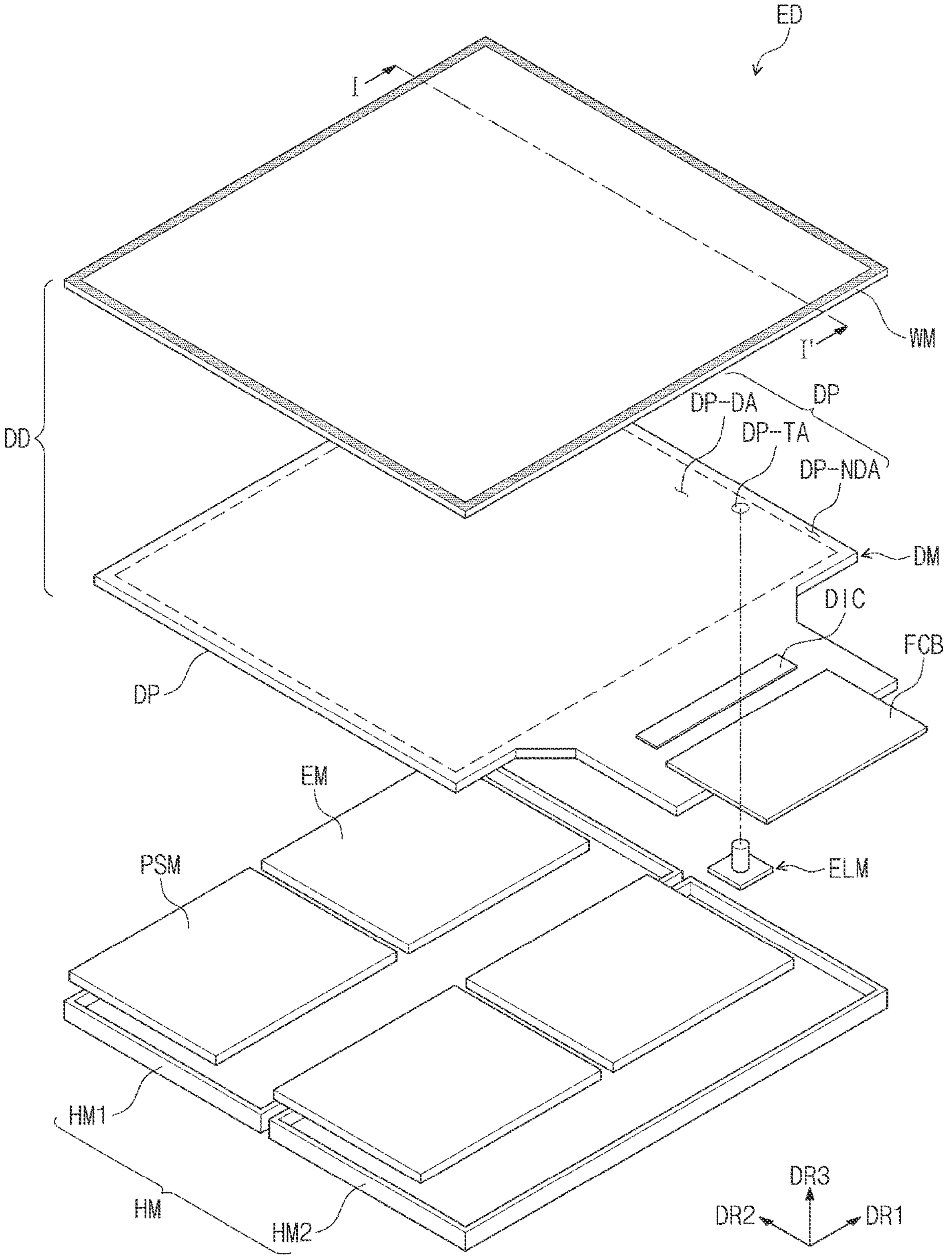
FIG. 2A is an exploded schematic perspective view of the electronic apparatus according to an embodiment.
Figure 2B:
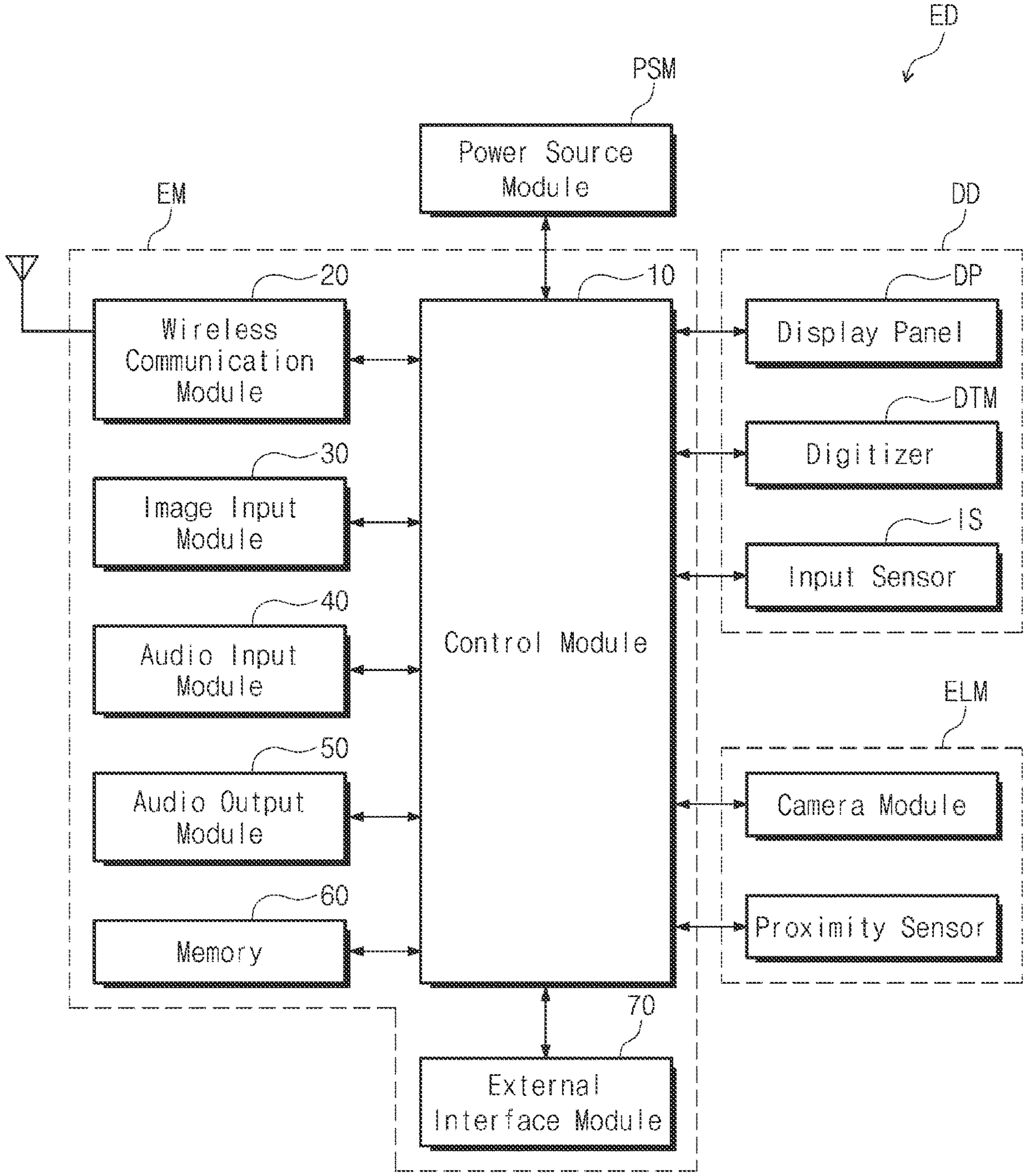
FIG. 2B is a schematic block diagram of the electronic apparatus according to an embodiment.

FIG. 2A is an exploded schematic perspective view of the electronic apparatus according to an embodiment. FIG. 2B is a schematic block diagram of the electronic apparatus according to an embodiment.

As illustrated in FIGS. 2A and 2B, the electronic apparatus ED may include a display device DD, an electronic module EM, an electro-optical module ELM, a power source module PSM, and a housing HM. For example, the electronic apparatus ED may further include a mechanical structure for controlling a folding operation of the display device DD.

The display device DD may generate an image and may detect an external input. The display device DD may include a window module WM and a display module DM. The window module WM may provide a front surface of the electronic apparatus ED. The window module WM will be described below in detail.

The display module DM may include at least a display panel DP. Although only the display panel DP among the laminated structures of the display module DM is illustrated in FIG. 2A, the display module DM may further include components disposed above the display panel DP. Detailed descriptions of the laminated structures of the display module DM will be described below.

The display panel DP is not limited, and may be, for example, an emission type display panel such as an organic light emitting display panel or an inorganic light emitting display panel. The display panel DP may be a display panel including a micro light emitting element such as a micro LED or a nano LED.

The display panel DP may include a display area DP-DA and a non-display area DP-NDA, which correspond to the display area DA (see FIG. 1A) and the non-display area NDA (see FIG. 1A) of the electronic apparatus ED. In the description, "area/portion and that area/portion corresponds" may mean that overlap each other and are not limited to the same area.

The display panel DP may include a sensing area DP-TA corresponding to the sensing area TA of FIG. 1A. The sensing area TA may have a resolution less than that of the display area DP-DA. A detailed description of the sensing area DP-TA will be described below.

Figure 9A:
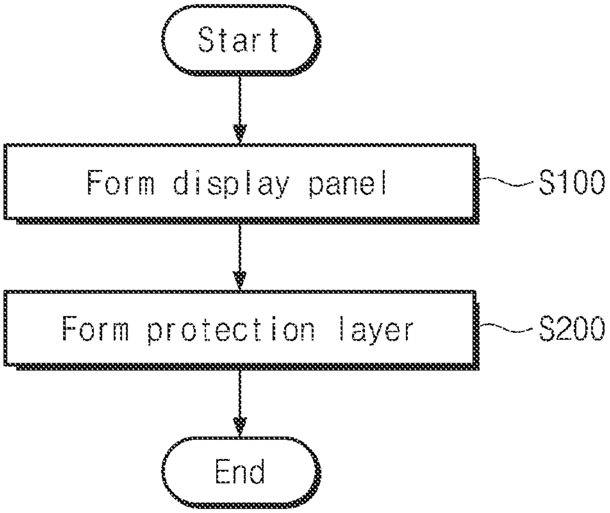
FIG. 9A is a flowchart illustrating a method for manufacturing a display device according to an embodiment.

As illustrated in FIG. 9A, a driving chip DIC may be disposed on the non-display area DP-NDA of the display panel DP. A flexible circuit board FCB may be coupled to the non-display area DP-NDA of the display panel DP. The flexible circuit board FCB may be connected to a main circuit board. The main circuit board may be one electronic component constituting the electronic module EM.

The driving chip DIC may include driving elements for driving pixels of the display panel DP, for example, a data driving circuit. FIG. 2A illustrates a structure in which the driving chip DIC is mounted on the display panel DP, but embodiments are not limited thereto. For example, the driving chip DIC may be mounted on the flexible circuit board FCB.

As shown in FIG. 2B, the display device DD may further include an input sensor IS and a digitizer DTM. The input sensor IS may sense a user's input. The capacitive input sensor IS may be disposed above the display panel DP. The digitizer DTM may detect an input of a stylus pen. The electromagnetic induction type digitizer DTM may be disposed below the display panel DP.

The electronic module EM may include a control module 10, a wireless communication module 20, an image input module 30, an audio input module 40, an audio output module 50, a memory 60, and an external interface module 70. The electronic module EM may include a main circuit board, and the modules may be mounted on the main circuit board or electrically connected to the main circuit board through the flexible circuit board. The electronic module EM may be electrically connected to the power source module PSM.

Referring to FIG. 2B, the electronic module EM may be disposed in each of a first housing HM1 and a second housing HM2, and the power source module PSM may be disposed in each of the first housing HM1 and the second housing HM2. For example, the electronic module EM disposed in the first housing HM1 and the electronic module EM disposed in the second housing HM2 may be electrically connected to each other through the flexible circuit board.

The control module 10 may control an overall operation of the electronic apparatus ED. For example, the control module 10 may activate or inactivates the display device DD according to a user input. The control module 10 may control the image input module 30, the audio input module 40, the audio output module 50, and the like in accordance with the user input. The control module 10 may include at least one microprocessor.

The wireless communication module 20 may transmit/receive a wireless signal to/from the other terminal by using Bluetooth or Wi-Fi. The wireless communication module 20 may transmit/receive a voice signal by using a general communication line. The wireless communication module 20 may include antenna modules.

The image input module 30 may process an image signal to convert the processed image signal into image data that is capable of being displayed on the display device DD. The audio input module 40 may receive an external audio signal by using a microphone in a recording mode or a voice recognition mode to convert the received audio signal into electrical sound data. The audio output module 50 may convert the audio data received from the wireless communication module 20 or the audio data stored in the memory 60 to output the converted audio data to the outside.

The external interface module 70 may function as an interface connected to an external charger, a wired/wireless data port, and a card socket (for example, a memory card and an SIM/UIM card).

The power source module PSM may supply power necessary for the overall operation of the electronic apparatus ED. The power source module PSM may include a typical battery device.

The electro-optical module ELM may be an electronic component that outputs or receives an optical signal. The electro-optical module ELM may include a camera module and/or a proximity sensor. The camera module may photograph an external image through the sensing area DP-TA.

The housing HM illustrated in FIG. 2A may be coupled to the display device DD, e.g., the window module WM to accommodate other modules. The housing HM is illustrated as including first and second housings HM1 and HM2 separated from each other, but embodiments are not limited thereto. For example, the electronic apparatus ED may further include a hinge structure for connecting the first and second housings HM1 and HM2 to each other.

Figure 3A:
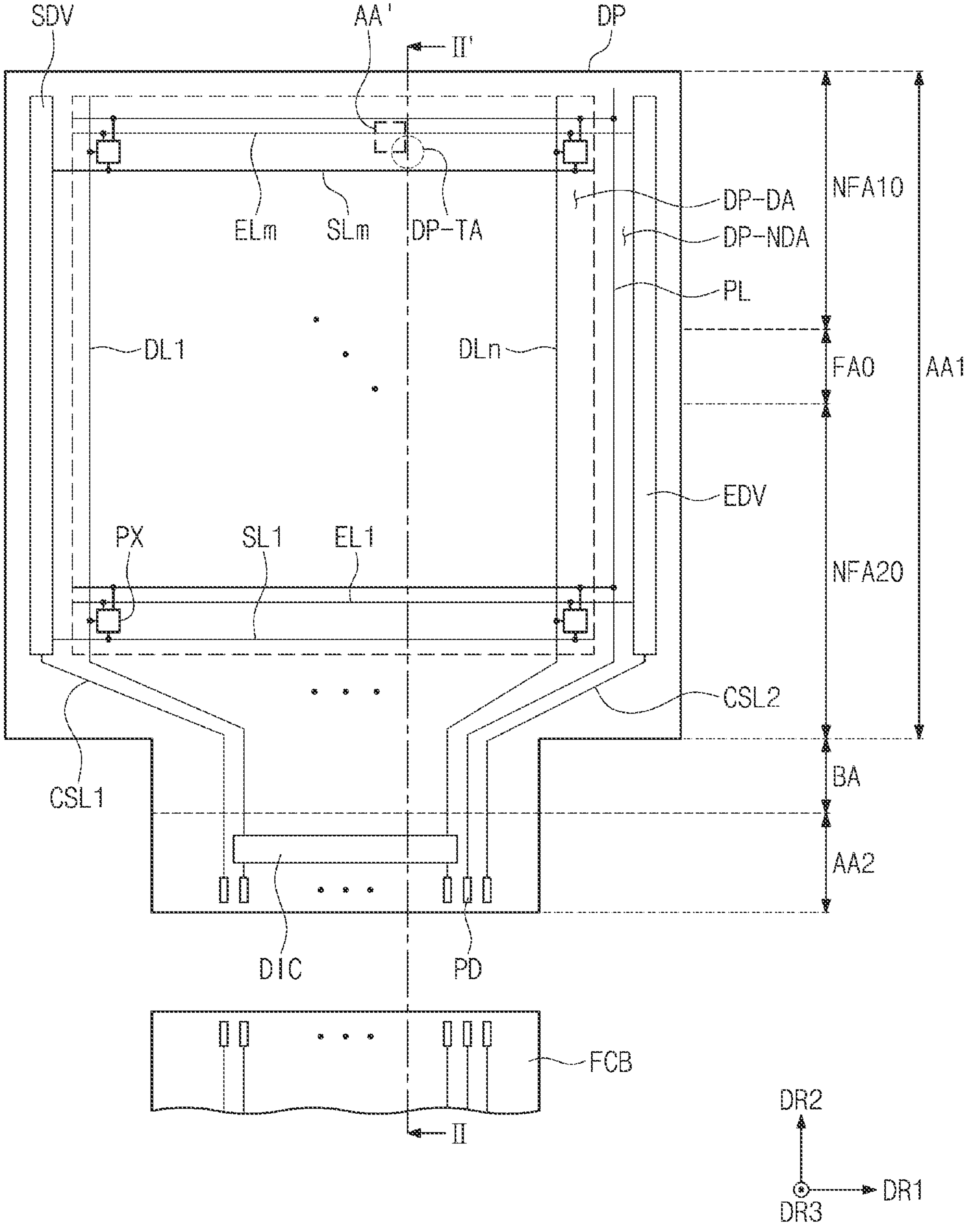
FIG. 3A is a schematic plan view of a display panel according to an embodiment.
Figure 3B:
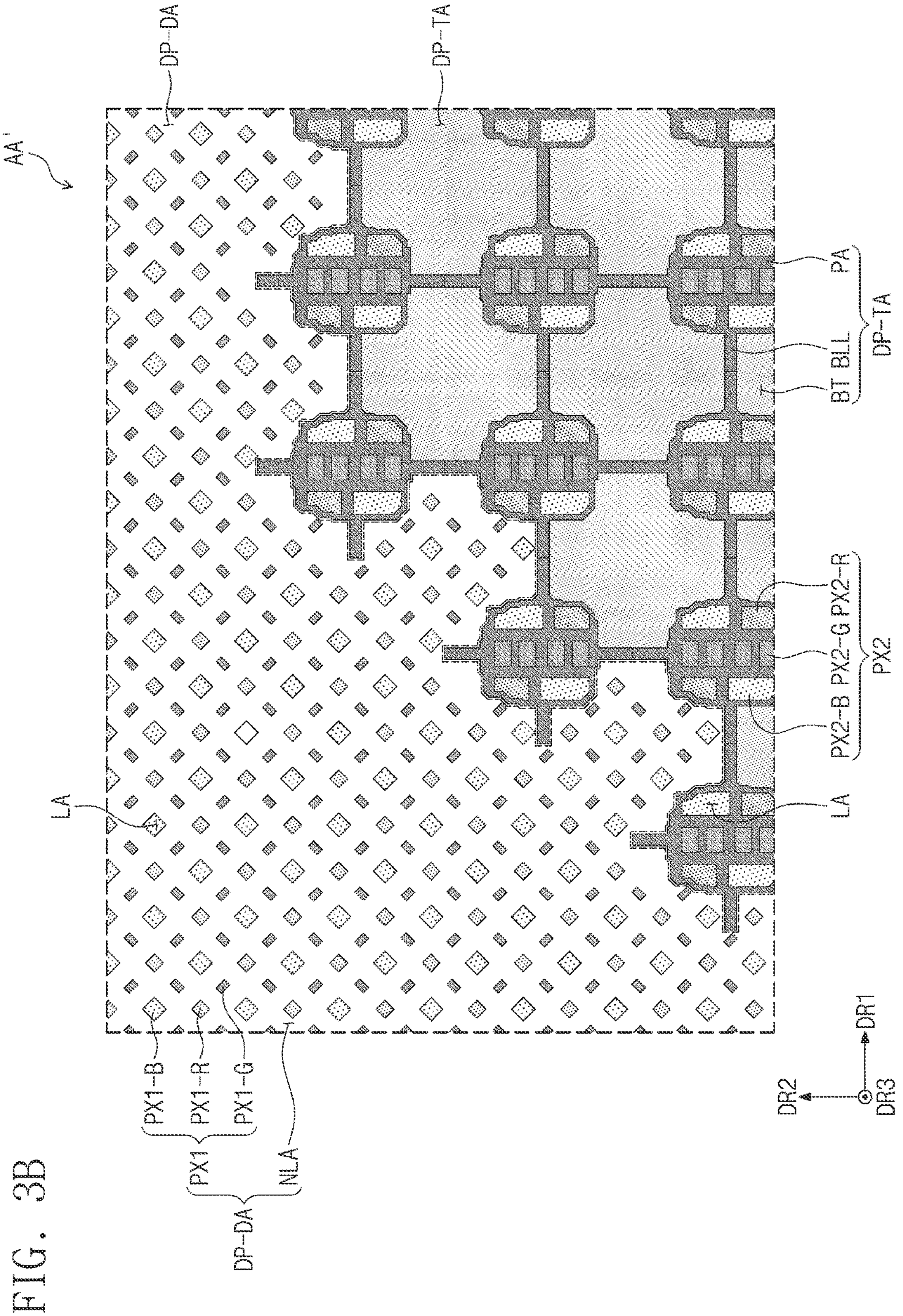
FIG. 3B is a schematic plan view illustrating a portion of an area of the display panel according to an embodiment.

FIG. 3A is a schematic plan view of the display panel according to an embodiment. FIG. 3B is a schematic plan view illustrating a portion of an area of the display panel according to an embodiment. FIG. 3B is an enlarged schematic plan view illustrating a partial area AA' of FIG. 3A.

Referring to FIG. 3A, the display panel DP may include a display area DP-DA and a non-display area DP-NDA around the display area DP-DA. The display area DP-DA and the non-display area DP-NDA may be distinguished by existence of a pixel PX. The pixel PX may be disposed on the display area DP-DA. A scan driver SDV, a data driver, and an emission driver EDV may be disposed on the non-display area DP-NDA. The data driver may be a partial circuit formed in a driving chip DIC illustrated in FIG. 3A.

The display panel DP may include a first area AA1, a second area AA2, and a bending area BA, which are divided in the second direction DR2. Each of the second area AA2 and the bending area BA may be a partial area of the non-display area DP-NDA. The bending area BA may be disposed between the first area AA1 and the second area AA2.

The first area AA1 may correspond to the display surface DS of FIG. 1A. The first area AA1 may include a first non-folding area NFA10, a second non-folding area NFA20, and a folding area FA0. The first non-folding area NFA10, the second non-folding area NFA20, and the folding area FA0 may correspond to the first non-folding area NFA1, the second non-folding area NFA2, and the folding area FA0 of FIGS. 1A to 1C, respectively.

A length of each of the bending area BA and the second area AA2 in the first direction DR1 may be less than that of the first area AA1. A region having a short length in a direction of the bending axis may be bent more readily.

The display panel DP may include pixels PX, scan lines SL1 to SLm, data lines DL1 to DLn, emission lines EL1 to ELm, first and second control lines CSL1 and CSL2, a power line PL, and pads PD. Here, m and n may be natural numbers. The pixels PX may be connected to the scan lines SL1 to SLm, the data lines DL1 to DLn, and the emission lines EL1 to ELm.

The scan lines SL1 to SLm may extend in the second direction DR2 and be connected to the scan driver SDV. The data lines DL1 to DLn may extend in the second direction DR2 and be connected to the driving chip DIC via the bending area BA. The emission lines EL1 to ELm may extend in the first direction DR1 and may be connected to an emission driver EDV.

The first power line PL1 may include a portion extending in the second direction DR2 and a portion extending in the first direction DR1. The portion extending in the first direction DR1 and the portion extending in the second direction DR2 may be disposed on different layers. The portion of the power line PL, which extends in the second direction DR2, may extend to the second area AA2 via the bending area BA. The power line PL1 may provide pixels PX having a first voltage.

The first control line CSL1 may be connected to the scan driver SDV to extend toward a lower end of the second area AA2 via the bending area BA. The second control line CSL2 may be connected to the emission driver EDV to extend toward the lower end of the second area AA2 via the bending area BA.

In a plan view, the pads PD may be disposed adjacent to the lower end of the second area AA2. The driving chip DIC, the power line PL, the first control line CSL1, and the second control line CSL2 may be connected to the pads PD. The flexible circuit board FCB may be electrically connected to the pads PD through an anisotropic conductive adhesive layer.

Referring to FIG. 3B, the sensing area DP-TA may have light transmittance greater than that of the display area DP-DA and resolution less than that of the display area DP-DA. The light transmittance and the resolution may be measured within a reference area. The sensing area DP-TA may have an occupancy rate of a light blocking structure within the reference area, which is less than that of the display area DP-DA. The light blocking structure may include a conductive pattern layer of a circuit layer, an electrode of a light emitting element, a light blocking pattern layer, and the like, which will be described below.

The sensing area DP-TA may have resolution within the reference area, which is less than that of the display area DP-DA. The smaller number of pixels may be disposed within the reference surface (or the same area) as compared to the number of pixels within the display area.

As illustrated in FIG. 3B, a first pixel PX1 may be disposed on the display area DP-DA, and a second pixel PX2 may be disposed on the sensing area DP-TA. As comparing surface areas of the same color pixels to each other, the first pixel PX1 and the second pixel PX2 may have emission areas different from each other. The first pixel PX1 and the second pixel PX2 may have different arrangements.

In FIG. 3B, emission areas LA of the first pixel PX1 and the second pixel PX2 may be shown to represent the first pixel PX1 and the second pixel PX2. Each of the emission areas LA may be defined as an area on which an anode of a light emitting element is exposed from a pixel defining layer. A non-emission area NLA may be disposed between the emission areas LA within the display area DP-DA.

The first pixel PX1 may include a first color pixel PX1-R, a second color pixel PX1-G, and a third color pixel PX1-B, and the second pixel PX2 may include a first color pixel PX2-R, a second color pixel PX2-G, and a third color pixel PX2-B. Each of the first pixel PX1 and the second pixel PX2 may include a red pixel, a green pixel, and a blue pixel.

The sensing area DP-TA may include a pixel area PA, a line area BLL, and a transmission area BT. The second pixel PX2 may be disposed within the pixel area PA. Although a structure in which two first color pixels PX2-R, four second color pixels PX2-G, and second third color pixels PX2-B are disposed within a pixel area PA (e.g., a single pixel area) is illustrated, embodiments are not limited thereto.

A conductive pattern layer, a signal line, or a light blocking pattern layer related to the second pixel PX2 may be disposed within the pixel area PA and the line area BLL. The light blocking pattern layer may be a metal pattern layer and may substantially overlap the pixel area PA and the line area BLL. Each of the pixel area PA and the line area BLL may be a non-transmission area.

The transmission area BT may be an area through which an optical signal substantially passes. Since the second pixel PX2 is not disposed on the transmission area BT, a conductive pattern layer, a signal line, or a light blocking pattern layer may be disposed. Thus, the transmission area BT may increase in light transmittance of the sensing area DP-TA.

Figure 4:
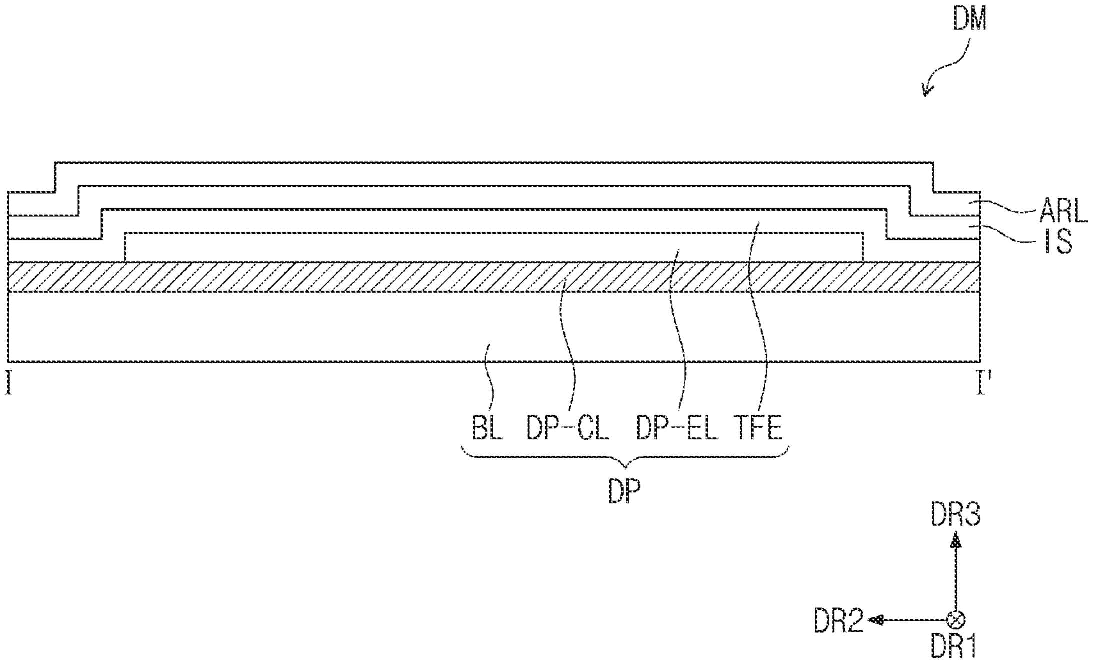
FIG. 4 is a schematic cross-sectional view of the display module according to an embodiment.

FIG. 4 is a schematic cross-sectional view of the display module according to an embodiment.

Referring to FIG. 4, the display module DM may include a display panel DP, an input sensor IS, and an antireflection layer ARL. The display panel DP may include a base substrate BL, a circuit layer DP-CL, a light emitting element layer DP-EL, and an encapsulation layer TFE.

The base substrate BL may provide a base surface on which the circuit layer DP-CL is disposed. The base substrate BL may be a flexible substrate capable of being bent, folded, or rolled. The base substrate BL may be a glass substrate, a metal substrate, or a polymer substrate. However, embodiments are not limited thereto. For example, the base substrate BL may be an inorganic layer, an organic layer, or a composite layer.

The base substrate BL may have a multilayered structure. For example, the base substrate BL may include a first synthetic resin layer, a multilayer or single inorganic layer, and a second synthetic resin layer disposed on the multilayer or single inorganic layer. Each of the first and second synthetic resin layers may include a polyimide-based resin, but embodiments are not limited thereto.

The circuit layer DP-CL may be disposed on the base substrate BL. The circuit layer DP-CL may include an insulating layer, a semiconductor pattern layer, a conductive pattern layer, and a signal line.

The light emitting element layer DP-EL may be disposed on the circuit layer DP-CL. The light emitting element layer DP-EL may include a light emitting element. For example, the light emitting element may include an organic light emitting material, an inorganic light emitting material, an organic-inorganic light emitting material, a quantum dot, a quantum rod, a micro LED, or a nano LED.

The encapsulation layer TFE may be disposed on the light emitting element layer DP-EL. The encapsulation layer TFE may protect the light emitting element layer DP-EL against foreign substances such as moisture, oxygen, and dust particles. The encapsulation layer TFE may include at least one inorganic layer. The encapsulation layer TFE may include a laminated structure of an inorganic layer/organic layer/inorganic layer.

The input sensor IS may be disposed (e.g., directly disposed) on the display panel DP. The display panel DP and the input sensor IS may be formed through a continuous process. Here, "directly disposed" may mean that a third component is not disposed between the input sensor IS and the display panel DP. For example, a separate adhesive layer may not be disposed between the input sensor IS and the display panel DP.

The antireflection layer ARL may be disposed (e.g., directly disposed) on the input sensor IS. The antireflection layer ARL may reduce reflectance of external light incident from the outside of the display device DD. The antireflection layer ARL may include color filters. The color filters may have a certain arrangement. For example, the color filters may be arranged in consideration of emission colors of the pixels provided in the display panel DP. For example, the antireflection layer ARL may further include a black matrix adjacent to the color filters.

In an embodiment, positions of the input sensor IS and the antireflection layer ARL may be interchanged with each other. In an embodiment, the antireflection layer ARL may be replaced with a polarizing film. The polarizing film may be coupled to the input sensor IS through the adhesive layer.

Figure 5:
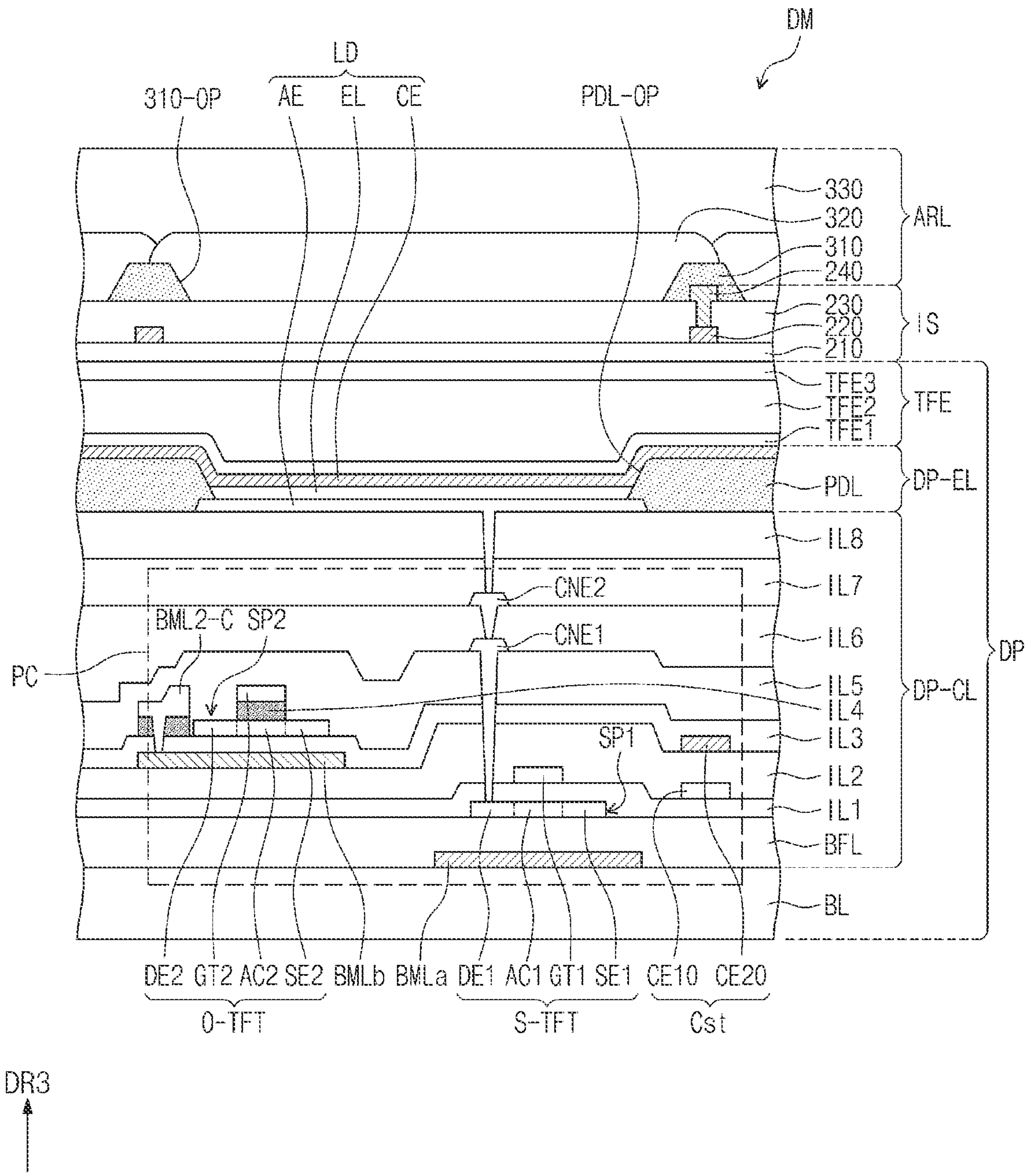
FIG. 5 is a schematic cross-sectional view illustrating a portion of the display module according to an embodiment.

FIG. 5 is a schematic cross-sectional view illustrating a portion of the display module according to an embodiment. In FIG. 5, a portion of the display module DM of FIG. 4 according to an embodiment is illustrated in detail. FIG. 5 illustrates components corresponding to a pixel of the display module DM according to an embodiment in more detail.

FIG. 5 illustrates a light emitting element LD and a silicon transistor S-TFT and an oxide transistor O-TFT of a pixel circuit PC. At least one of the transistors provided in the pixel circuit PC may be an oxide transistor O-TFT, and the remaining transistors may be silicon transistors S-TFT.

A buffer layer BFL may be disposed on a base substrate BL. The buffer layer BFL may prevent metal atoms or impurities from being diffused into the base substrate BL to a first semiconductor pattern layer SP1. The first semiconductor pattern layer SP1 may include an active region AC1 of the silicon transistor S-TFT. The buffer layer BFL may control a heat supply rate during a crystallization process for forming the first semiconductor pattern layer SP1 so that the first semiconductor pattern layer SP1 may be uniformly formed.

A first rear metal layer BMLa may be disposed below the silicon transistor S-TFT, and a second rear metal layer BMLb may be disposed below the oxide transistor O-TFT. The first and second rear metal layers BMLa and BMLb may be disposed to overlap the pixel circuit PC. The first and second rear metal layers BMLa and BMLb may block external light from reaching the pixel circuit PC.

The first rear metal layer BMLa may be disposed to correspond to (or overlap) at least a partial area of the pixel circuit PC. The first rear metal layer BMLa may be disposed to overlap a driving transistor implemented as the silicon transistor S-TFT.

The first rear metal layer BMLa may be disposed between the base substrate BL and the buffer layer BFL. In an embodiment, an inorganic barrier layer may be further disposed between the first rear metal layer BMLa and the buffer layer BFL. The first rear metal layer BMLa may be connected (e.g., electrically connected) to electrodes or lines and may receive a constant voltage or signal from the electrodes or lines. According to an embodiment, the first rear metal layer BMLa may be a floating electrode in a shape that is isolated from other electrodes or wires.

The second rear metal layer BMLb may be disposed to correspond to (or overlap) a lower portion of the oxide transistor O-TFT. The second rear metal layer BMLb may be disposed between a second insulating layer IL2 and a third insulating layer IL3. The second rear metal layer BMLb and a second electrode CE20 of a storage capacitor Cst may be disposed on the same layer (e.g., second insulating layer IL2). The second rear metal layer BMLb may be connected (e.g., electrically connected) to a contact electrode BML2-C to receive a constant voltage or signal. The contact electrode BML2-C and a gate GT2 of the oxide transistor O-TFT may be disposed on the same layer (e.g., a fourth insulating layer IL4).

Each of the first rear metal layer BMLa and the second rear metal layer BMLb may include a reflective metal. For example, each of the first rear metal layer BMLa and the second rear metal layer BMLb may include silver (Ag), an alloy containing silver (Ag), molybdenum (Mo), an alloy containing molybdenum, aluminum (Al), an alloy containing aluminum, aluminum nitride (AlN), tungsten (W), tungsten nitride (WN), copper (Cu), and p+ doped amorphous silicon. The first rear metal layer BMLa and the second rear metal layer BMLb may include the same material or different materials.

For example, according to an embodiment, the second rear metal layer BMLb may be omitted. The first rear metal layer BMLa may extend up to the lower portion of the oxide transistor O-TFT, so that the first rear metal layer BMLa may block light incident onto the lower portion of the oxide transistor O-TFT.

The first semiconductor pattern layer SP1 may be disposed on the buffer layer BFL. The first semiconductor pattern layer SP1 may include a silicon semiconductor. For example, the silicon semiconductor may include amorphous silicon, polycrystalline silicon, and the like. For example, the first semiconductor pattern layer SP1 may include low-temperature polysilicon.

FIG. 5 illustrates only a portion of the first semiconductor pattern layer SP1 disposed on the buffer layer BFL, and the first semiconductor pattern layer SP1 may be further disposed on another area. The first semiconductor pattern layer SP1 may be arranged in a specific rule across the pixels. The first semiconductor pattern layer SP1 may have different electrical properties according to whether the first semiconductor pattern layer SP1 is doped. The first semiconductor pattern layer SP1 may include a first region having high conductivity and a second region having low conductivity. The first region may be doped with an N-type dopant or a P-type dopant. A P-type transistor may include a doped region doped with the P-type dopant, and an N-type transistor may include a doped region doped with the N-type dopant. The second region may be a non-doped region or may be doped at a concentration less than that of the first region.

The first region may have conductivity greater than that of the second region and may substantially function as an electrode or a signal line. The second region may substantially correspond to an active region (or channel) of the transistor. For example, a portion of the first semiconductor pattern layer SP1 may be an active region of the transistor, another portion may be a source or drain region of the transistor, and further another portion may be a connection electrode or a connection signal line.

A source region SE1 (or source), an active region AC1 (or channel), and a drain region DE1 (or drain) of the silicon transistor S-TFT may be formed from the first semiconductor pattern layer SP1. The source region SE1 and the drain region DE1 may extend in opposite directions from the active region AC1 on a cross-section.

The first insulating layer IL1 may be disposed on the buffer layer BFL. The first insulating layer IL1 may overlap the pixels in common to cover the first semiconductor pattern layer SP1. The first insulating layer IL1 may include an inorganic layer and/or an organic layer and have a single-layered structure or a multilayered structure. The first insulating layer IL1 may include at least one of aluminum oxide, titanium oxide, silicon oxide, silicon nitride, silicon oxynitride, zirconium oxide, and/or hafnium oxide. In an embodiment, the first insulating layer IL1 may include a single-layered silicon oxide layer. The insulating layer of the circuit layer DP-CL, which will be described below, as well as the first insulating layer IL1 may be an inorganic layer and/or an organic layer and may have a single-layered structure or a multilayered structure. The inorganic layer may include at least one of the above-described materials, but embodiments are not limited thereto.

A gate GT1 of the silicon transistor S-TFT may be disposed on the first insulating layer IL1. The gate GT1 may be a portion of a metal pattern layer. The gate GT1 may overlap the active region AC1. In a process of doping the first semiconductor pattern layer SP1, the gate GT1 may function as a mask. The gate GT1 may include titanium (Ti), silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), indium tin oxide (ITO), indium zinc oxide (IZO), and the like, but embodiments are not limited thereto.

The second insulating layer IL2 may be disposed on the first insulating layer IL1 to cover the gate GT1. The third insulating layer IL3 may be disposed on the second insulating layer IL2. The second electrode CE20 of the storage capacitor Cst may be disposed between the second insulating layer IL2 and the third insulating layer IL3. For example, the first electrode CE10 of the storage capacitor Cst may be disposed between the first insulating layer IL1 and the second insulating layer IL2.

The second semiconductor pattern layer SP2 may be disposed on the third insulating layer IL3. The second semiconductor pattern layer SP2 may include an active region AC2 of an oxide transistor O-TFT, which will be described below. The second semiconductor pattern layer SP2 may include an oxide semiconductor. However, the second semiconductor pattern layer SP2 may include transparent conductive oxide TCO such as indium tin oxide (ITO), indium zinc oxide (IZO), indium gallium zinc oxide (IGZO), zinc oxide (ZnO), or indium oxide ($In_2O_3$).

The oxide semiconductor may include a plurality of regions classified according to whether the transparent conductive oxide is reduced. A region in which the transparent conductive oxide is reduced (hereinafter, referred to as a reduction region) may have conductivity higher than that of a region in which the transparent conductive oxide is not reduced (hereinafter, referred to as a non-reduction region). The reduction region substantially may function as a source/drain of a transistor or a signal line. The non-reduction region may substantially correspond to the semiconductor region (or active region or channel) of the transistor. For example, a portion of the second semiconductor pattern layer SP2 may be a semiconductor region of the transistor, another portion may be a source/drain region of the transistor, and another portion may be a signal transmission area.

A source region SE2 (or source), an active region AC2 (or channel), and a drain region DE2 (or drain) of the oxide transistor O-TFT may be formed from the second semiconductor pattern layer SP2. The source region SE2 and the drain region DE2 may extend in opposite directions from the active region AC2 on a cross-section.

The fourth insulating layer IL4 may be disposed on the third insulating layer IL3. As illustrated in FIG. 5, the fourth insulating layer IL4 may be an insulating pattern layer that overlaps the gate GT2 of the oxide transistor O-TFT and is exposed by the source region SE2 and drain region DE2 of the oxide transistor O-TFT. As illustrated in FIG. 5, the fourth insulating layer IL4 may cover the second semiconductor pattern layer SP2.

As illustrated in FIG. 5, the gate GT2 of the oxide transistor O-TFT may be disposed on the fourth insulating layer IL4. The gate GT2 of the oxide transistor O-TFT may be a portion of the metal pattern layer. The gate GT2 of the oxide transistor O-TFT may overlap the active region AC2.

The fifth insulating layer IL5 may be disposed on the fourth insulating layer IL4 to cover the gate GT2. The first connection electrode CNE1 may be disposed on the fifth insulating layer IL5. The first connection electrode CNE1 may be connected (e.g., electrically connected) to the drain region DE1 of the silicon transistor S-TFT through a contact hole passing through the first to fifth insulating layers IL1, IL2, IL3, IL4, and IL5.

The sixth insulating layer IL6 may be disposed on the fifth insulating layer IL5. The second connection electrode CNE2 may be disposed on the sixth insulating layer IL6. The second connection electrode CNE2 may be connected (e.g., electrically connected) to the first connection electrode CNE1 through a contact hole passing through the sixth insulating layer IL6. The seventh insulating layer IL7 may be disposed on the sixth insulating layer IL6 to cover the second connection electrode CNE2. The eighth insulating layer IL8 may be disposed on the seventh insulating layer IL7.

Each of the sixth insulating layer IL6, the seventh insulating layer IL7, and the eighth insulating layer IL8 may be an organic layer. For example, each of the sixth insulating layer IL6, the seventh insulating layer IL7, and the eighth insulating layer IL8 may include general-purpose polymers such as benzocyclobutene (BCB), polyimide, hexamethyldisiloxane (HMDSO), polymethylmethacrylate (PMMA), or polystyrene (PS), a polymer derivative having a phenolic group, an acrylic polymer, an imide polymer, an aryl ether polymer, an amide polymer, a fluorine polymer, a p-xylene polymer, a vinyl alcohol polymer, and a blend thereof.

The light emitting element LD may include a first electrode AE, an emission layer EL, and a second electrode CE. The second electrode CE may be commonly provided on light emitting elements.

The first electrode AE of the light emitting element LD may be disposed on the eighth insulating layer IL8. The first electrode AE of the light emitting element LD may be a semi-transmissive electrode, a transmissive electrode, or a reflective electrode. According to an embodiment, the first electrode AE of the light emitting element LD may include a reflective layer made of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent or translucent electrode layer disposed on the reflective layer. The transparent electrode layer or a translucent electrode layer may include at least one or more selected from the group consisting of indium tin oxide (ITO), indium zinc oxide (IZO), indium gallium zinc oxide (IGZO), zinc oxide (ZnO) or indium oxide ($In_2O_3$), and aluminum doped zinc oxide (AZO). For example, the first electrode AE of the light emitting element LD may include a laminated structure of ITO/Ag/ITO.

A pixel defining layer PDL may be disposed on the eighth insulating layer IL8. The pixel defining layer PDL may have a property of absorbing light and may have, for example, a black color. The pixel defining layer PDL may include a black coloring agent. A black component may include a black dye and a black pigment. The black component may include carbon black, a metal such as chromium, or oxide thereof. The pixel defining layer PDL may correspond to a light blocking pattern layer having light blocking properties.

The pixel defining layer PDL may cover a portion of the first electrode AE of the light emitting element LD. For example, an opening PDL-OP exposing a portion of the first electrode AE of the light emitting element LD may be defined in the pixel defining layer PDL. The pixel defining layer PDL may increase in distance between an edge of the first electrode AE and the second electrode CE of the light emitting element LD. Thus, it may play a role of preventing arc or the like from occurring at the edge of the first electrode AE by the pixel defining layer PDL.

For example, a hole control layer may be disposed between the first electrode AE and the emission layer EL. The hole control layer may include a hole transport layer and may further include a hole injection layer. An electron control layer may be disposed between the emission layer EL and the second electrode CE. The electron control layer may include an electron transport layer and may further include an electron injection layer. The hole control layer and the electron control layer may be commonly formed in the pixels PX (see FIG. 3A) by using an open mask.

The encapsulation layer TFE may be disposed on the light emitting element layer DP-EL. The encapsulation layer TFE may include an inorganic layer TFE1, an organic layer TFE2, and an inorganic layer TFE3, which are sequentially laminated, but the layers constituting the encapsulation layer TFE are not limited thereto.

The inorganic layers TFE1 and TFE3 may protect the light emitting element layer DP-EL from moisture and oxygen, and the organic layer TFE2 may protect the light emitting element layer DP-EL from foreign substances such as dust particles. Each of the inorganic layers TFE1 and TFE3 may include a silicon nitride layer, a silicon oxy nitride layer, a silicon oxide layer, a titanium oxide layer, or an aluminum oxide layer. The organic layer TFE2 may include an acrylic-based organic layer, but embodiments are not limited thereto.

The input sensor IS may be disposed on the display panel DP. The input sensor IS may be referred to as a sensor, an input sensing layer, or an input sensing panel. The input sensor IS may include a sensor base layer 210, a first conductive layer 220, a sensing insulating layer 230 and a second conductive layer 240.

The sensor base layer 210 may be disposed (e.g., directly disposed) on the display panel DP. The sensor base layer 210 may be an inorganic layer including at least one of silicon nitride, silicon oxynitride, and/or silicon oxide. In another example, the sensor base layer 210 may be an organic layer including an epoxy resin, an acrylic resin, or an imide-based resin. Each of the sensor base layer 210 may have a single-layered structure or a multilayered structure in which a plurality of layers are laminated in the third direction DR3.

Each of the first conductive layer 220 and the second conductive layer 240 may have a single-layered structure or a multilayered structure in which a plurality of layers are laminated in the third direction DR3. The first conductive layer 220 and the second conductive layer 240 may include conductive lines defining mesh-shaped sensing electrodes. The conductive lines may not overlap the opening PDL-OP and may overlap the pixel defining layer PDL.

The conductive layer having the single-layered structure may include a metal layer or a transparent conductive layer. The metal layer may include molybdenum, silver, titanium, copper, aluminum, or an alloy thereof. The transparent conductive layer may include transparent conductive oxide such as indium tin oxide (ITO), indium zinc oxide (IZO), zinc oxide (ZnO), indium zinc tin oxide (IZTO), or the like. For example, the transparent conductive layer may include conductive polymers such as poly(3,4-ethylenedioxythiophene) (PEDOT), metal nanowires, graphene, and the like.

The conductive layer of the multilayer structure may include sequentially laminated metal layers. The metal layers may have a three-layered structure of titanium/aluminum/titanium. The conductive layer having the multilayered structure may include at least one metal layer and at least one transparent conductive layer.

The sensing insulating layer 230 may be disposed between the first conductive layer 220 and the second conductive layer 240. The sensing insulating layer 230 may include an inorganic layer. The inorganic layer may include at least one of aluminum oxide, titanium oxide, silicon oxide, silicon nitride, silicon oxynitride, zirconium oxide, and/or hafnium oxide.

In another example, the sensing insulating layer 230 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and/or a perylene-based resin.

An antireflection layer ARL may be disposed on the input sensor IS. The antireflection layer ARL may include a division layer 310, color filters 320, and a planarization layer 330.

A material forming the division layer 310 is not limited as long as it is a material that absorbs light. The division layer 310 may be a layer having a black color, and in an embodiment, the division layer 310 may include a black coloring agent. A black component may include a black dye and a black pigment. The black component may include carbon black, a metal such as chromium, or oxide thereof.

The division layer 310 may cover the second conductive layer 240 of the input sensor IS. The division layer 310 may prevent external light from being reflected by the second conductive layer 240. In a partial area of the display module DM, the division layer 310 may be omitted. Transmittance of an area on which the division layer 310 is omitted and not disposed may be higher than that of each of other areas.

An opening 310-OP may be defined in the division layer 310. The opening 310-OP may overlap the first electrode AE of the light emitting element LD. Any one of the color filters 320 may overlap the first electrode AE of the light emitting element LD. Any one of the color filters 320 may cover the opening 310-OP. Each of the color filters 320 may be in contact with the division layer 310.

The planarization layer 330 may cover the division layer 310 and the color filters 320. The planarization layer 330 may include an organic material and may provide a flat surface on a top surface (or upper surface) of the planarization layer 330. In an embodiment, the planarization layer 330 may be omitted.

Figure 6A:
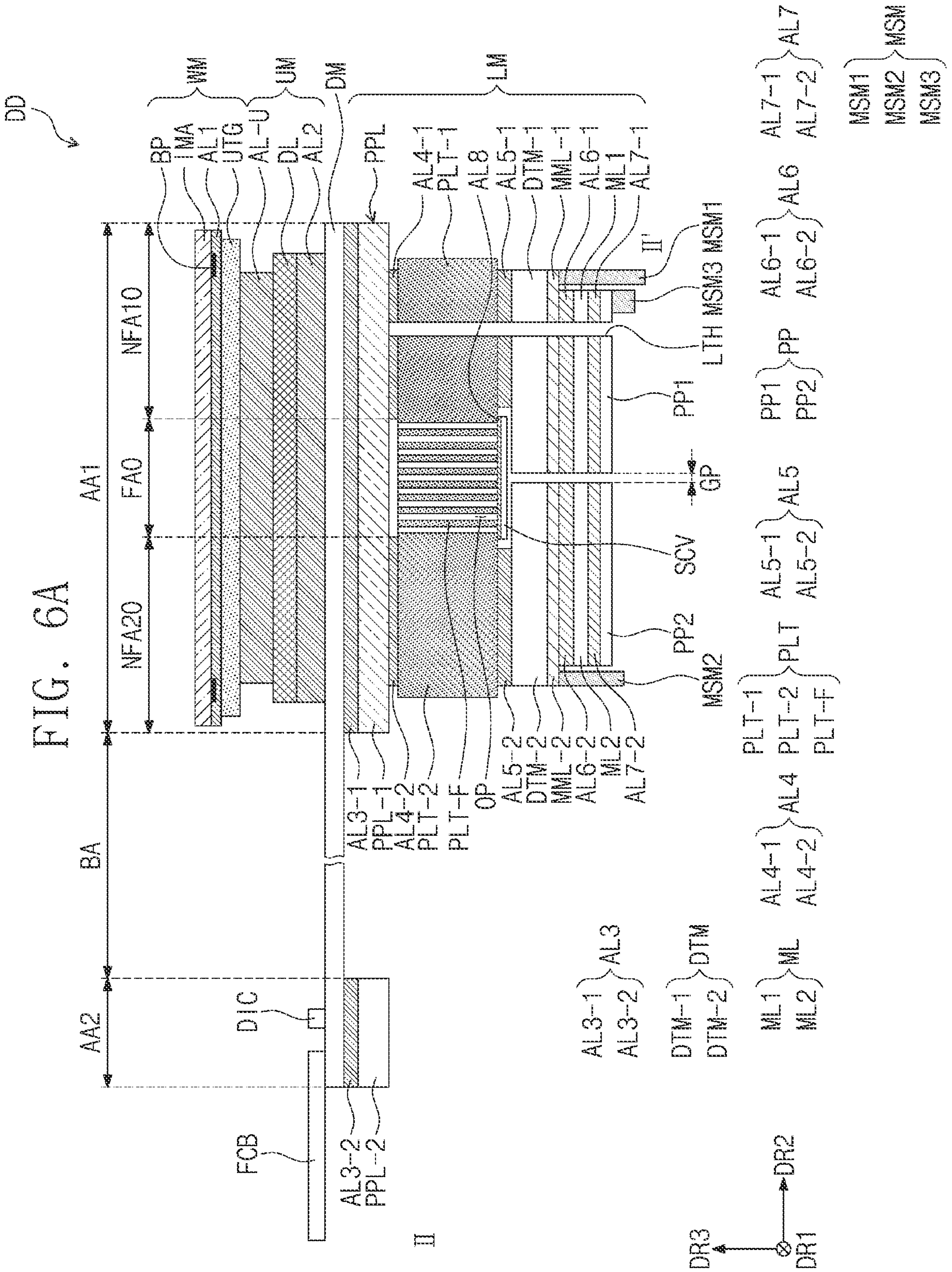
FIGS. 6A and 6B are cross-sectional views of the display device according to an embodiment.
Figure 6B:
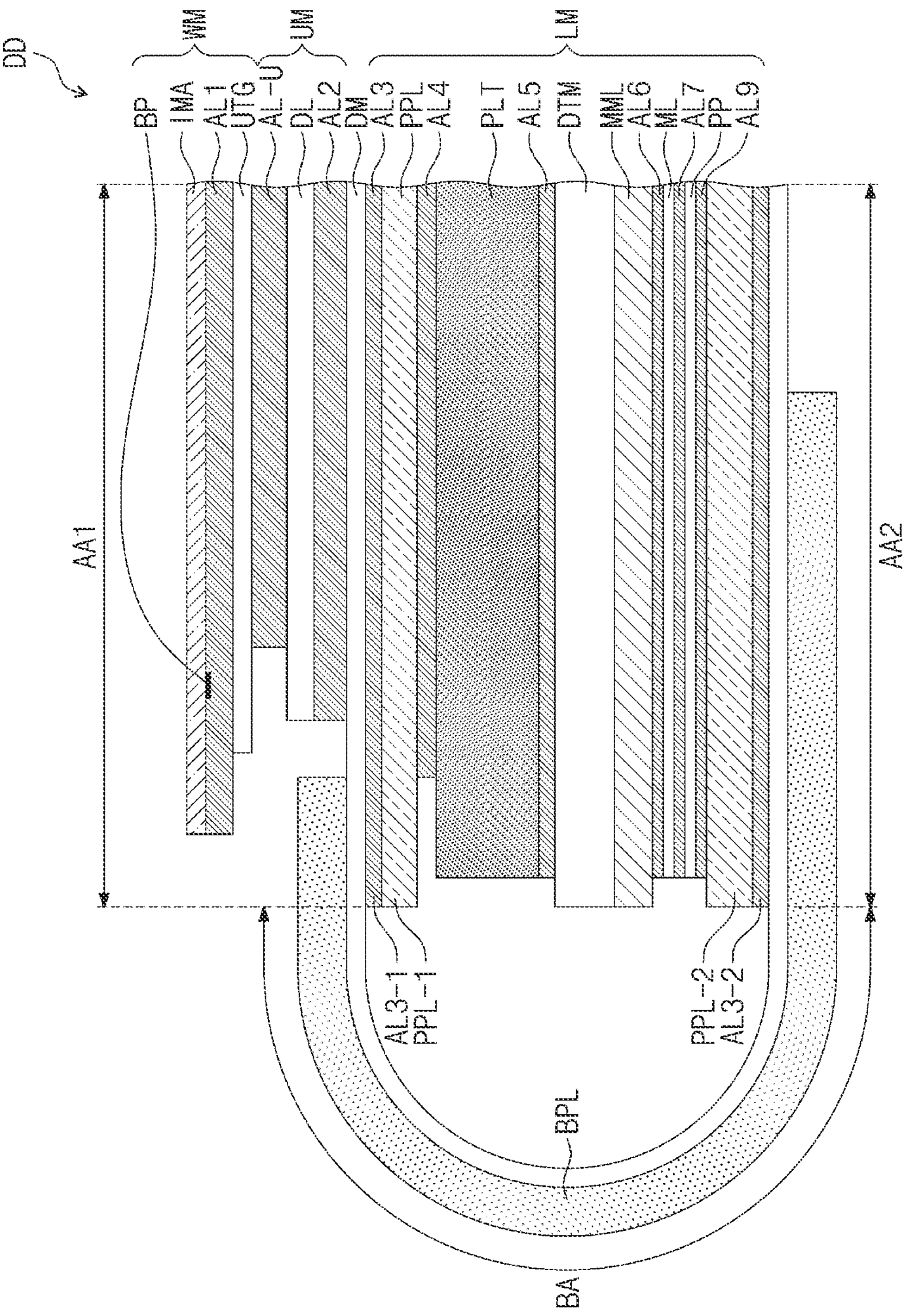
Figure 7A:
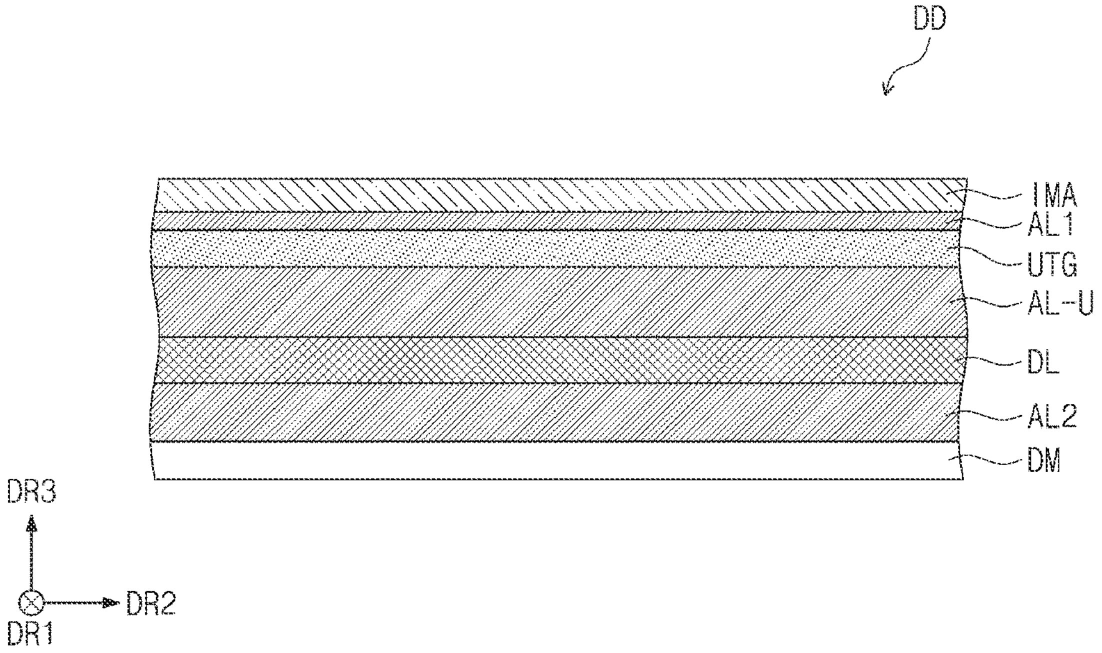
FIGS. 7A, 7B, and 7C are cross-sectional views illustrating some of components of the display device according to an embodiment.

FIGS. 6A and 6B are schematic cross-sectional views of the display device according to an embodiment. FIG. 7A is a schematic cross-sectional view illustrating some components of the display device according to an embodiment. In FIG. 7A, only a portion of the components of the display device DD, which is disposed on the display module DM, among the components of the display device DD illustrated in FIG. 6A is illustrated. For example, FIG. 7A illustrates the window module WM, an upper member UM, and functional layers provided in the display module DM, and a lower member LM is omitted.

FIG. 6A illustrates an unfolded state in which the display module DM is not bent. FIG. 6A illustrates a state in which a bending area BA (see FIG. 3A) of the display module DM is bent. In FIGS. 6A and 6B, areas that divides the display module DM are illustrated based on the display panel DP of FIG. 3A.

Referring to FIGS. 6A and 6B, the display device DD may include the window module WM, the upper member UM, the display module DM, and the lower member LM. The upper member UM collectively refers to a component disposed between the window module WM and the display module DM, and the lower member LM collectively refers to a component disposed below the display module DM.

The window module WM may include a window UTG, a protection layer IMA disposed on the window UTG, and a bezel pattern layer BP disposed on a bottom surface (or lower surface) of the protection layer IMA. The window module WM may include a first adhesive layer AL1 that couples the protection layer IMA to the window UTG.

Referring to FIG. 7A, the protection layer IMA may be disposed on the window UTG. The protection layer IMA may be disposed on the window UTG. The protection layer IMA may be disposed on the window UTG to protect the window UTG and the functional layers disposed under the window UTG against a pressure applied from the outside, thereby preventing the display device DD from being deformed. The protection layer IMA may include a base layer BF (see FIGS. 8A to 8D) and a polymer resin. The polymer resin may be impregnated into the base layer BF (see FIGS. 8A to 8D). A detailed description of the protection layer IMA will be described below.

Referring again to FIGS. 6A and 6B, the bezel pattern layer BP may overlap the non-display area NDA illustrated in FIG. 1A. The bezel pattern layer BP may be disposed on a surface of the window UTG or a surface of the protection layer IMA. FIGS. 6A and 6B illustrate the bezel pattern layer BP disposed on a bottom surface (or lower surface) of the protection layer IMA as an example. Without being limited thereto, the bezel pattern layer BP may be disposed on a top surface (or upper surface) of the protection layer IMA. The bezel pattern layer BP may be formed as a colored light blocking layer, for example, in a coating manner. The bezel pattern layer BP may include a base material and a dye or pigment mixed with the base material.

A thickness of the window UTG may be about 10 μm or more and about 100 μm or less. A thickness of the window UTG may be, for example, about 20 μm or more and about 90 μm or less. In case that the thickness of the window UTG is less than about 10 μm, sufficient impact resistance may not be exhibited, and in case that the thickness of the window UTG exceeds about 100 μm, folding or bending properties of the display device DD may be deteriorated due to the thick thickness of the window UTG.

The protection layer IMA may have a thickness equal to or less than that of the window UTG. For example, a thickness ratio of the protection layer IMA and the window UTG may be about 0.3:1 to about 1:1. In case that the thickness ratio of the protection layer IMA and the window UTG satisfies the aforementioned range, the display device DD may exhibit/have high flexibility with exhibiting/having sufficient strength against the external impact. Thus, the display device DD having excellent impact resistance and high flexibility may be implemented.

The window UTG may be chemically strengthened glass. Although the window UTG is repeatedly folded and unfolded, an occurrence of wrinkles may be minimized.

The first adhesive layer AL1 may be a pressure sensitive adhesive film (PSA) or an optically clear adhesive (OCA). Adhesive layers to be described below may be also the same as the first adhesive layer AL1.

The first adhesive layer AL1 may be separated from the window UTG. Since strength of the protection layer IMA is lower than that of the window UTG, scratches may occur relatively readily. After the first adhesive layer AL1 and the protective film PF are separated from each other, a new protective film PF may be attached to the window UTG.

The upper member UM may include an upper film DL. The upper film DL may include a synthetic resin film. The synthetic resin film may include polyimide, polycarbonate, polyamide, triacetylcellulose, polymethylmethacrylate, or polyethylene terephthalate.

The upper film DL may absorb an external impact applied to the front surface of the display device DD. As illustrated in FIG. 5, the display module DM according to an embodiment may include a structure of an antireflection layer ARL, which includes color filters 320 in place of the polarizing film, and thus, front impact strength of the display device DD may be reduced. The upper film DL may compensate for the reduced impact strength by applying the antireflection layer ARL including the color filter 320. In an embodiment, the upper film DL may be omitted.

The upper member UM may include a second adhesive layer AL2 that couples the upper film DL to the window module WM and a third adhesive layer AL3 that couples the upper film DL to the display panel DP. Each of the additional adhesive layer AL-U and the second adhesive layer AL2 may be a pressure sensitive adhesive film (PSA) or an optically clear adhesive (OCA). For example, each of the additional adhesive layer AL-U and the second adhesive layer AL2 may include the pressure sensitive adhesive film.

The lower member LM may include a lower protective film PPL, a first support layer PLT, a cover layer SCV, a digitizer DTM, an electromagnetic shielding layer MML, a metal layer ML, a second support layer PP, and third to ninth adhesive layers AL3 to AL9. The third to ninth adhesive layers AL3 to AL9 may include an adhesive such as a pressure sensitive adhesive or an optically transparent adhesive. Some of the above-described constituents according to an embodiment may be omitted.

The lower protective film PPL may be disposed below the display module DM. The lower protective film PPL may protect a lower portion of the display module DM. The lower protective film PPL may include a flexible synthetic resin film. For example, the lower protection film PPL may include polyethylene terephthalate.

In an embodiment, the lower protective film PPL may not be disposed on the bending area BA. The lower protective film PPL may include a first lower protective film PPL-1 protecting a first area AA1 of the display panel DP (see FIG. 3A) and a second lower protective film PPL-2 protecting a second area AA2 of the display panel DP (see FIG. 3A).

The third adhesive layer AL3 may couple the lower protective film PPL to the display panel DP. The third adhesive layer AL3 may include a first portion AL3-1 corresponding to the first lower protection film PPL-1 and a second portion AL3-2 corresponding to the second lower protection film PPL-2.

The lower protective film PPL may be disposed under the base substrate BL of the display panel DP described above with reference to FIGS. 4 and 5. In an embodiment, the third adhesive layer AL3 may be disposed (e.g., directly disposed) under the base substrate BL of the display panel DP, and the lower protective film PPL may be disposed (e.g., directly disposed) under the third adhesive layer AL3.

As illustrated in FIG. 6B, in case that the bending area BA is bent, the second lower protection film PPL-2 may be disposed below the first area AA1 and the first lower protection film PPL-1 together with the second area AA2. Since the lower protection film PPL is not disposed on the bending area BA, the bending area BA may be more readily bent. The second lower protective film PPL-2 may be attached to the second support layer PP through the ninth adhesive layer AL9. The ninth adhesive layer AL9 may be omitted.

As illustrated in FIG. 6B, the bending area BA may have a certain curvature and curvature radius. The curvature radius may be about 0.1 mm to about 0.5 mm. The bending protection layer BPL may be disposed on at least the bending area BA. The bending protection layer BPL may overlap the bending area BA, the first area AA1 and the second area AA2. The bending protection layer BPL may be disposed on a portion of the first area AA1 and a portion of the second area AA2.

The bending protection layer BPL may be bent together with the bending area BA. The bending protection layer BPL may protect the bending area BA from an external impact and may control a neutral plane of the bending area BA. The bending protection layer BPL may control stress of the bending area BA so that the neutral plane may approach the signal lines disposed on the bending area BA.

As illustrated in FIGS. 6A and 6B, the fourth adhesive layer AL4 may couple the lower protective film PPL to the first support layer PLT. In the description, the fourth adhesive layer AL4 may be referred to as a first additional adhesive layer.

The fourth adhesive layer AL4 may include a first portion AL4-1 and a second portion AL4-2, which are spaced apart from each other. A spaced distance (or gap) between the first portion AL4-1 and the second portion AL4-2 may correspond to a width of a folding area FA0 and may be greater than a gap GP to be described below. The spaced distance between the first portion AL4-1 and the second portion AL4-2 may be about 7 mm to about 15 mm, e.g., about 9 mm to about 13 mm.

In an embodiment, the first portion AL4-1 and the second portion AL4-2 may be defined as different portions of an adhesive layer, but embodiments are not limited thereto. In case that the first portion AL4-1 is defined as an adhesive layer (e.g., the first adhesive layer or the second adhesive layer), the second portion AL4-2 may be defined as the other adhesive layer (e.g., the second adhesive layer or the third adhesive layer). All of the above definitions may be applied not only to the fourth adhesive layer AL4 but also to adhesive layers including the two portions among adhesive layers to be described below.

The fourth adhesive layer AL4 may be disposed (e.g., directly disposed) under the lower protective film PPL, and the first support layer PLT may be disposed (e.g., directly disposed) under the fourth adhesive layer AL4. For example, in the display device DD according to an embodiment, the first support layer PLT may be attached (e.g., directly attached) under the lower protective film PPL through the fourth adhesive layer AL4, and no other components may be disposed therebetween. In the display device DD according to an embodiment, no components other than the fourth adhesive layer AL4 may be disposed between the lower protective film PPL and the first support layer PLT disposed below the display module DM, and thus, repulsive force according to the folding operation may be reduced.

Referring to FIG. 6A, the first support layer PLT may be disposed under the lower protective film PPL. The first support layer PLT may support components disposed at an upper side of the support layer and may maintain the unfolded state and the folded state of the display device DD. The first support layer PLT may have strength greater than that of the lower protective film PPL. The first support layer PLT may include a first support portion PLT-1 corresponding to (or overlapping) at least a first non-folding area NFA10 and a second support portion PLT-2 corresponding to (or overlapping) a second non-folding area NFA20. The first support portion PLT-1 and the second support portion PLT-2 may be spaced apart from each other in the second direction DR2.

As in an embodiment, the first support layer PLT may include a folding portion PLT-F which corresponds to the folding area FA0 and is disposed between the first support portion PLT-1 and the second support portion PLT-2 and in which openings OP are defined. The openings OP may be arranged so that the folding area FA0 may have a lattice shape in a plan view. The first support portion PLT-1, the second support portion PLT-2, and the folding portion PLT-F may have an integral shape.

The folding portion PLT-F may prevent foreign substance from being permeated into a lower portion of a central area of the lower protective film PPL opened from the first support portion PLT-1 and the second support portion PLT-2 during the folding operation illustrated in FIGS. 1B and 1C. Flexibility of the folding portion PLT-F may be improved by the openings OP. For example, since the fourth adhesive layer AL4 is not disposed on the folding portion PLT-F, flexibility of the first support layer PLT may be improved. In an embodiment, the folding portion PLT-F may be omitted. For example, the first support layer PLT may include the first support portion PLT-1 and the second support portion PLT-2, which are spaced apart from each other.

The first support layer PLT may be selected from materials capable of transmitting an electromagnetic field generated by the digitizer DTM to be described below without a loss or with a minimal loss. The first support layer PLT may include an insulating material. The first support layer PLT may include a non-metal material. The first support layer PLT may include a reinforcing fiber composite material. The first support layer PLT may include a reinforcing fiber disposed inside a matrix part. In an embodiment, the reinforcing fiber may include a carbon fiber or a glass fiber. The matrix part may include a polymer resin. The matrix part may include a thermoplastic resin. For example, the matrix part may include a polyamide-based resin or a polypropylene-based resin. For example, the reinforcing fiber composite may be carbon fiber reinforced plastic (CFRP) or glass fiber reinforced plastic (GFRP).

The cover layer SCV and the digitizer DTM may be disposed below the first support layer PLT. The cover layer SCV may be disposed to overlap the folding area FA0. The digitizer DTM may include a first digitizer DTM-1 and a second digitizer DTM-2 respectively overlapping the first support portion PLT-1 and the second support portion PLT-2. A portion of each of the first digitizer DTM-1 and the second digitizer DTM-2 may be disposed below the cover layer SCV.

The fifth adhesive layer AL5 may couple the first support layer PLT to the digitizer DTM, and the eighth adhesive layer AL8 may couple the cover layer SCV to the first support layer PLT. The fifth adhesive layer AL5 may include a first portion AL5-1 coupling the first support portion PLT-1 to the first digitizer DTM-1 and a second portion AL5-2 coupling the second support portion PLT-2 to the second digitizer DTM-2. In the description, the fifth adhesive layer AL5 may be referred to as a second additional adhesive layer.

The cover layer SCV may be disposed between a first portion AL5-1 and a second portion AL5-2 in the second direction DR2. The cover layer SCV may be spaced apart from the digitizer DTM to prevent an interference with the digitizer DTM in the unfolded state.

The cover layer SCV may be manufactured in the form of a sheet and attached to the first support layer PLT. The cover layer SCV may be attached below a portion corresponding to the folding portion PLT-F of the first support layer PLT. The cover layer SCV may be attached below the folding portion PLT-F to block moisture and foreign substances from being introduced/permeated into the openings OP defined in the folding portion PLT-F. The cover layer SCV may include a material having a low modulus of elasticity, for example, thermoplastic polyurethane. The cover layer SCV may be attached under the folding portion PLT-F of the first support layer PLT and may be disposed under most of the first support portion PLT-1 and the second support portion PLT-2.

The digitizer DTM may also be called an EMR sensing panel and may include loop coils that generate a magnetic field having a preset resonant frequency with respect to an electronic pen. The magnetic field generated in the loop coils may be applied to an LC resonance circuit constituted by an inductor (e.g., coil) and a capacitor of the electronic pen. The coils may generate current by the received magnetic field and transfer the generated current to the capacitor. Thus, the capacitor may charge the current input from the coil and discharge the charged current to the coil. As a result, the magnetic fields of the resonant frequency may be emitted to the coil. The magnetic field emitted by the electronic pen may be absorbed again by the loop coils of the digitizer, and thus, a proximate position of the electronic pen on a touch screen may be determined.

The digitizer DTM may include a first digitizer DTM-1 and a second digitizer DTM-2. The first digitizer DTM-1 and the second digitizer DTM-2 may be spaced a certain gap GP from each other. The gap GP may be about 0.3 mm to about 3 mm and may be disposed to correspond to (or overlap) the folding area FA0.

The electromagnetic shielding layer MML may be disposed below the digitizer DTM. The electromagnetic shielding layer MML may be disposed (e.g., disposed directly) under the digitizer DTM. The electromagnetic shielding layer MML may perform an electromagnetic shielding function. As the electromagnetic shielding layer MML performs the electromagnetic shielding function, an influence of electromagnetic waves, which are generated from the electronic module EM (see FIG. 2A), the electro-optical module ELM (see FIG. 2A), and the power source module PSM (see FIG. 2A) disposed below the digitizer DTM, on the digitizer DTM and the display panel DP may be minimized. For example, as the electromagnetic shielding layer MML is disposed, the sensitivity of the digitizer DTM may be improved, and a signal applied to the digitizer DTM may be uniform, and thus, the reliability of the display device DD may be improved.

The electromagnetic shielding layer MML may include magnetic metal powder MMP. The electromagnetic shielding layer MML may include the magnetic metal powder to perform an electromagnetic shielding function. The magnetic metal powder provided in the electromagnetic shielding layer MML may include a soft magnetic powder alloy. The electromagnetic shielding layer MML may include, for example, iron (Fe), silicon (Si), and aluminum (Al).

The electromagnetic shielding layer MML may include a first electromagnetic shielding layer MML-1 and a second electromagnetic shielding layer MML-2. The first electromagnetic shielding layer MML-1 may be disposed below the first digitizer DTM-1, and the second electromagnetic shielding layer MML-2 may be disposed below the second digitizer DTM-2. The first electromagnetic shielding layer MML-1 may be disposed (e.g., directly disposed) under the first digitizer DTM-1, and the second electromagnetic shielding layer MML-2 may be disposed (e.g., directly disposed) under the second digitizer DTM-2.

The metal layer ML may be disposed under the electromagnetic shielding layer MML. The metal layer ML may include a first metal layer ML1 and a second metal layer ML2, which respectively overlap the first support portion PLT-1 and the second support portion PLT-2. The metal layer ML may release heat generated in case that the digitizer DTM is driven to the outside. The metal layer ML may transfer the heat generated by the digitizer DTM to a lower side. The metal layer ML may have electrical conductivity and thermal conductivity greater than those of a metal plate to be described below. The metal layer ML may include copper or aluminum. The metal layer ML having relatively high electrical conductivity may block electromagnetic waves, which are generated from the electronic module EM (see FIG. 2A), the electro-optical module ELM (see FIG. 2A), and the power source module PSM (see FIG. 2A) disposed below the digitizer DTM, from being affected on the digitizer DTM as noise. For example, the lower member LM according to an embodiment may include the electromagnetic shielding layer MML and the metal layer ML disposed below the digitizer DTM to prevent the performance of the digitizer DTM from being deteriorated by electronic components such as electronic modules provided in the electronic apparatus.

The sixth adhesive layer AL6 may couple the electromagnetic shielding layer MML to the metal layer ML. The sixth adhesive layer AL6 may include a first portion AL6-1 and a second portion AL6-2, which respectively correspond to the first metal layer ML1 and the second metal layer ML2. In the description, the sixth adhesive layer AL6 may be referred to as a third additional adhesive layer.

A second support layer PP may be disposed below the metal layer ML. The second support layer PP may include a second-first support layer PP1 and a second-second support layer PP2, which overlap the first metal layer ML1 and the second metal layer ML2, respectively. The second support layer PP may absorb an external impact applied from a lower side.

The second support layer PP may have insulating properties. For example, the second support layer PP may include an insulating material. In an embodiment, the second support layer PP may include, for example, a polymer film. The second support layer PP may include polyimide, polycarbonate, polyamide, triacetylcellulose, polymethylmethacrylate, or polyethylene terephthalate. For example, the second support layer PP may include polyethylene terephthalate.

The seventh adhesive layer AL7 may couple the metal layer ML to the second support layer PP. The seventh adhesive layer AL7 may include a first portion AL7-1 and a second portion AL7-2, which correspond to the second-first support layer PP1 and the second-second support layer PP2. In the description, the seventh adhesive layer AL7 may be referred to as a lower adhesive layer.

A bottom surface (or lower surface) of at least a portion of the second support layer PP may define the lowermost surface of the lower member LM. A bottom surface (or lower surface) of at least a portion of the second support layer PP may define the lowermost surface of the display device DD. For example, in the display device DD according to an embodiment, other components may not be disposed on the bottom surface (or lower surface) of at least a portion of the second support layer PP. Other surfaces other than a partial surface, on which a magnetic field shielding sheet MSM is disposed, on the bottom surface (or lower surface) of the second support layer PP may define the lowermost surface of the lower member LM. In an embodiment, the magnetic field shielding sheet MSM may be disposed below a portion of the second support layer PP, and a functional layer such as a heat dissipation layer may not be disposed on a portion other than the portion on which the magnetic field shielding sheet MSM is disposed and thus may be disposed as an exposed surface.

The magnetic field shielding sheet MSM may be disposed below the second support layer PP. The magnetic field shielding sheet MSM shields the magnetic field generated from the electronic component disposed therebelow. The magnetic field shielding sheet MSM may prevent the magnetic field generated from the electronic component from interfering with the digitizer DTM. The electronic component may include an electronic module EM, an electro-optical module ELM, and a power source module PSM, which are described above with reference to FIGS. 2A and 2B.

The magnetic field shielding sheet MSM may include a plurality of portions. For example, the magnetic field shielding sheet MSM may include a first magnetic field shielding sheet MSM1, a second magnetic field shielding sheet MSM2, and a third magnetic field shielding sheet MSM3 (see FIG. 6A). At least a portion of the plurality of portions may have a different thickness. For example, a thickness of the first magnetic field shielding sheet MSM1 may be greater than a thickness of the second magnetic field shielding sheet MSM2, and the thickness of the second magnetic field shielding sheet MSM2 may be greater than a thickness of the third magnetic field shielding sheet MSM3. The plurality of portions may be disposed to correspond to (or overlap) stepped portions of a bracket disposed below the display device DD. The magnetic field shielding sheet MSM may have a structure in which the magnetic field shielding layer and the adhesive layers are alternately laminated. The third magnetic field shielding sheet MSM3 may be attached (e.g., directly attached) under the second support layer PP (e.g., the second-first support layer PP1). For example, the first magnetic field shielding sheet MSM1 may be attached (e.g., directly attached) under the electromagnetic shielding layer MML (e.g., the first electromagnetic shielding layer MML-1), and the second magnetic field shielding sheet MSM2 may be attached (e.g., directly attached) under the electromagnetic shielding layer MML (e.g., the second electromagnetic shielding layer MML-2).

A through-hole LTH may be defined in some members of the lower members LM. The through-hole LTH may be defined to overlap the sensing area DP-TA of FIG. 2A. As illustrated in FIG. 6A, the through-hole LTH may pass from the fifth adhesive layer AL5 to the second support layer PP. The through-hole LTH may have a structure that is similar to a structure from which the light blocking structure is removed from a path of the optical signal, and the through-hole LTH may improve optical signal reception efficiency of the electro-optical module ELM.

Figure 7B:
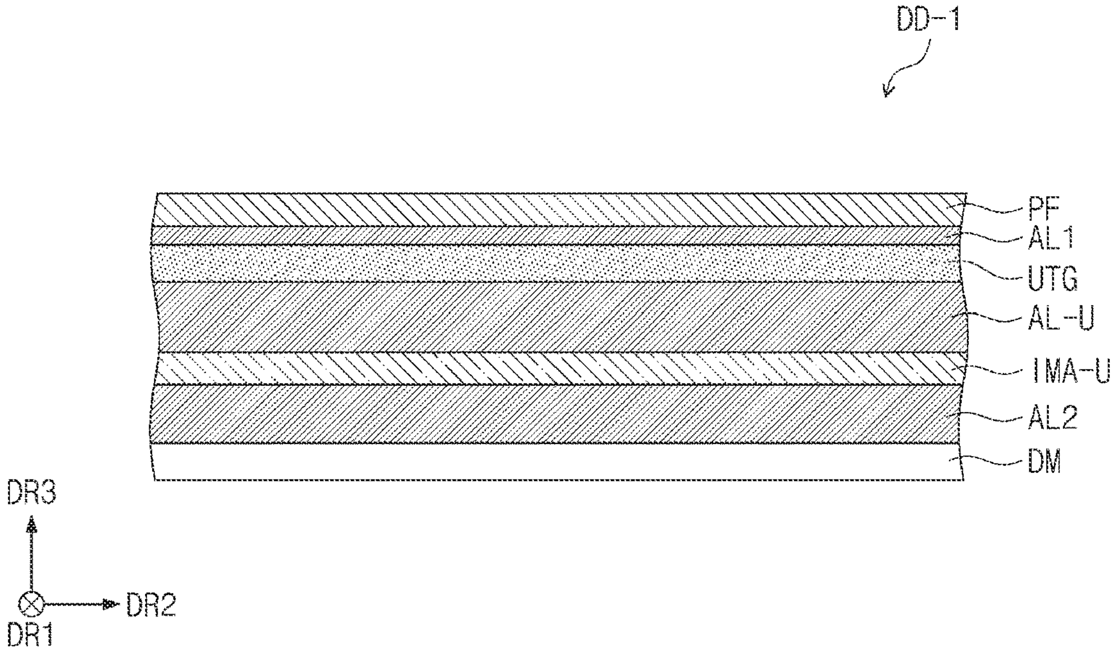
Figure 7C:
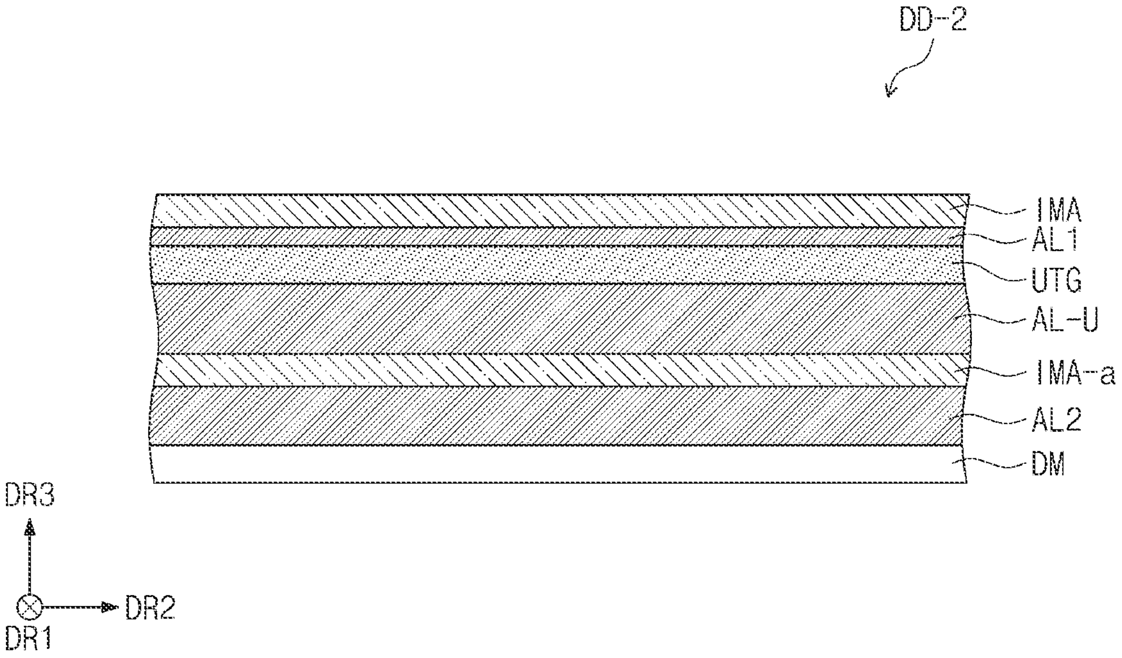

FIGS. 7B and 7C are schematic cross-sectional views illustrating some components of the display panel according to an embodiment. In FIGS. 7B and 7C, only some components of the components of the display device DD, which are disposed on the display module DM, among the components of the display device DD illustrated in FIG. 6A are illustrated. For example, in FIGS. 7B and 7C, the window module WM, the upper member UM, and the display module DM illustrated in FIG. 6A are illustrated, and the lower member LM is omitted. Hereinafter, in describing the display device DD according to an embodiment with reference to FIGS. 7B and 7C, the same reference numerals are given to the components described above in FIGS. 6A, 6B, and 7A, and detailed description thereof is omitted for descriptive convenience.

Referring to FIG. 7B, an arrangement of the protection layer IMA-U in the display device DD-1 according to an embodiment may be different from that of the display device DD illustrated in FIG. 7A.

Referring to FIG. 7B, the protection layer IMA-U may be disposed between the display module DM and the window UTG. The second adhesive layer AL2 may be disposed between the protection layer IMA-U and the display module DM. The second adhesive layer AL2 may include a common adhesive or an adhesive agent. The second adhesive layer AL2 may be an optically clear adhesive film (OCA) or an optically clear adhesive resin layer (OCR).

In an embodiment, the protection layer IMA-U may be attached on the display module DM by the second adhesive layer AL2. The protection layer IMA-U may be disposed on the antireflection layer ARL (FIG. 5) provided in the display module DM. The second adhesive layer AL2 may be disposed between the protection layer IMA-U and the antireflection layer ARL (FIG. 5). The second adhesive layer AL2 may be disposed (e.g., directly disposed) on the antireflection layer ARL (FIG. 5). The protection layer IMA-U may be disposed (e.g., directly disposed) on the second adhesive layer AL2. However, embodiments are not limited thereto, and the second adhesive layer AL2 may be omitted. For example, the protection layer IMA-U may be disposed (e.g., directly disposed) on the antireflection layer ARL (FIG. 5).

The protection layer IMA-U may include upper and lower surfaces that face each other in the third direction DR3, which is a thickness direction. The bottom surface (or lower surface) of the protection layer IMA-U may be disposed adjacent to the display module DM. The top surface (or upper surface) of the protection layer IMA-U may be spaced apart from the display module DM and may face the bottom surface (or lower surface) of the protection layer IMA-U. The top surface (or upper surface) of the protection layer IMA-U may be disposed adjacent to the window UTG.

The second adhesive layer AL2 may include a top surface (or upper surface) and a bottom surface facing the top surface (or upper surface) in the third direction DR3. The bottom surface (or lower surface) of the second adhesive layer AL2 may be disposed adjacent to the display module DM. The top surface (or upper surface) of the second adhesive layer AL2 may be spaced apart from the display module DM and may face the bottom surface (or lower surface) of the second adhesive layer AL2 in the third direction DR3. The top surface (or upper surface) of the second adhesive layer AL2 may be disposed adjacent to the window UTG. As illustrated in FIG. 7B, in case that the second adhesive layer AL2 is disposed between the protection layer IMA-U and the display module DM, the bottom surface (or lower surface) of the second adhesive layer AL2 may be in contact with the top surface (or upper surface) of the antireflection layer ARL (see FIG. 5), and the top surface (or upper surface) of the second adhesive layer AL2 may be in contact with the bottom surface (or lower surface) of the protection layer IMA-U. However, embodiments are not limited thereto.

Referring to FIGS. 6A and 7B, the window module WM may include a window protection layer PF. The window protection layer PF may be disposed on the window UTG. In an embodiment, the window protection layer PF may include a synthetic resin film. The window module WM may include a first adhesive layer AL1 that couples the window protection layer PF to the window UTG. The window protection layer PF may be attached on the window UTG by the first adhesive layer AL1.

The window protection layer PF may have a thickness of about 50 μm to about 80 μm. The window protection layer PF may include polyimide, polycarbonate, polyamide, triacetylcellulose, polymethylmethacrylate, or polyethylene terephthalate. For example, at least one of a hard coating layer, an anti-fingerprint layer, or an antireflection layer may be disposed on a top surface (or upper surface) of the window protection layer PF.

Referring to FIG. 7C, a display device DD-2 according to an embodiment may further include an additional protection layer IMA-a as compared to the display device DD illustrated in FIG. 7A. The additional protection layer IMA-a may be disposed between the display module DM and the window UTG. The display device DD-2 according to an embodiment may include a protection layer IMA disposed on the window UTG, and the additional protection layer IMA-a disposed between the display module DM and the window UTG. The additional protection layer IMA-a may include a base layer BF (see FIGS. 8A to 8D) and a polymer resin. The additional protection layer IMA-a may include a base layer BF (see FIGS. 8A to 8D) and a polymer resin impregnated into the base layer BF (see FIGS. 8A to 8D). The description of the additional protection layer IMA-a may be equally applied to the protection layer IMA described above with reference to FIG. 7A. For example, the additional protection layer IMA-a may have the same configuration as the protection layer IMA except for an arrangement structure thereof.

Figure 8A:
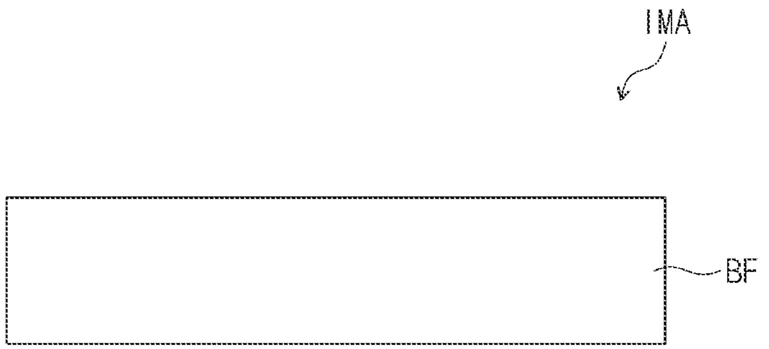
FIGS. 8A, 8B, 8C, and 8D are schematic cross-sectional views of a protection layer according to an embodiment.

FIG. 8A is a schematic cross-sectional view illustrating the protection layer according to an embodiment. The protection layer illustrated in FIG. 8A may be the protection layers IMA and IMA-U according to an embodiment, which is illustrated in FIGS. 6A, 6B, and 7A to 7C. The protection layer IMA illustrated in FIG. 8A may be used as the protection layers IMA and IMA-U of the display devices DD, DD-1 and DD-2 according to an embodiment, which is described with reference to FIGS. FIGS. 6A, 6B, and 7A to 7C. For example, the protection layer IMA according to an embodiment illustrated in FIG. 8A may be used as the additional protection layer IMA-a of the display device DD-2 according to an embodiment described with reference to FIG. 7C. Hereinafter, the description of the base layer BF provided in the protection layer IMA may be applied to the configurations of the protection layers IMA-1, IMA-2, and IMA-3 according to an embodiment described with reference to FIGS. 8B to 8D as well as the protection layer IMA according to an embodiment illustrated in FIG. 8A.

Referring to FIG. 8A, the protection layer IMA according to an embodiment may include a base layer BF. The base layer BF may provide a base surface of the protection layer IMA and may have a certain rigidity to protect the display module DM or the like, which is disposed below the protection layer IMA.

The base layer BF may have a porous structure. Pores may be defined in the base layer BF. For example, the base layer BF may have a woven fabric or non-woven fabric having pores.

The base layer BF may include at least one selected from the group consisting of glass fiber, polypropylene, polyethylene, polytetrafluoroethylene, polyester, polyamide, cellulose, polysulfone, polyethersulphone, polyphenyleneoxide, polybenzimidazole, polyimide, polyvinylidene fluoride, polymethylmethacrylate, polyacrylonitrile, and polyvinyl chloride. In an embodiment, the base layer BF may include at least one selected from the group consisting of glass fiber, polypropylene, polyethylene, and polytetrafluoroethylene. However, embodiments are not limited thereto.

The protection layer IMA may include a polymer resin. The polymer resin may be impregnated into the protection layer IMA. The polymer resin may be impregnated into the protection layer IMA to be filled into pores defined in the protection layer IMA.

In an embodiment, the polymer resin may include at least one of an ionomer, a thermosetting resin, and a photocurable resin. For example, the polymer resin may include an ionomer such as nafion, flemion, or aciplex, or a thermoset or photocurable resin such as an acrylic resin, a methacrylic resin, a polyisoprene resin, a vinyl resin, an epoxy resin, an urethane resin, a cellulose resin, a siloxane resin, a polyamide resin, a perylene resin, a phenol resin, an urea resin, or a melamine resin.

In an embodiment, the polymeric resin may include an ionomer. The ionomer may be a proton conductive polymer electrolyte. In an embodiment, the ionomer may include a fluorine-based polymer. The ionomer may include at least one of nafion, flemion, and aciplex. In an embodiment, the ionomer may include nafion.

The polymer resin may be impregnated into the base layer BF. The polymer resin may be impregnated into at least a portion of the pores defined in the base layer BF. The polymer resin may be filled into at least a portion of the pores defined in the base layer BF.

The protection layer IMA according to an embodiment may be formed by impregnating the base layer BF having a porous structure with a polymer resin. In an embodiment, the protection layer IMA may be formed by immersing the base layer BF in a polymer solution containing a polymer resin.

The base layer BF may have a thickness of about 10 μm or more and about 150 μm or less. For example, the base layer BF may have a thickness of about 30 μm or more and about 100 μm or less. In case that a thickness of the base layer BF is less than about 10 μm, the base layer BF may not protect the lower display module DM (see FIG. 6A) due to a thin thickness thereof. In case that the thickness of the base layer BF is thicker than about 150 μm, the entire thickness of the display device DD (see FIG. 6A) may increase. In case that the display device DD (see FIG. 6A) is folded as illustrated in FIGS. 1A to 1C, folding characteristics may be deteriorated as the thickness of the base layer BF increases. In case that the thickness of the base layer BF satisfies the aforementioned range, the protection layer IMA may have excellent impact resistance and improved durability. Thus, the display module DM may be prevented from being damaged by an external impact.

Light transmittance of the base layer BF may be less than about 90%. In an embodiment, the light transmittance of the base layer BF may be about 50% or less. The light transmittance of the base layer BF may be about 50% or less of light transmittance with respect to light in the visible ray region. For example, the base layer BF according to an embodiment may have light transmittance of about 50% or less at a wavelength of about 550 nm.

The protection layer IMA according to an embodiment may include a base layer BF. However, embodiments are not limited thereto, and in the window protection layer PF according to an embodiment, the base layer BF may be provided in plurality, and the base layers BF may be sequentially laminated. In case that the base layer BF are provided in plurality, the base layers BF may include the same type of material or may be made of materials different from each other.

Light transmittance of the protection layer IMA may be about 90% or more. In describing the light transmittance of the protection layer IMA, the "light transmittance" may mean light transmittance in the visible ray region. For example, the "light transmittance" may mean light transmittance in a wavelength range of about 380 nm or more and about 780 nm or less.

The protection layer IMA may exhibit/have excellent optical properties. Light transmittance of the protection layer IMA may be about 90% or more. For example, the light transmittance of the protection layer IMA may be about 90% or more and about 100% or less. The light transmittance of the protection layer IMA may be about 90% or more for light in the visible ray region. For example, the protection layer IMA according to an embodiment may have high transmittance of about 90% or more in the visible light region having a wavelength of about 380 nm or more and about 780 nm or less. In case that the light transmittance of the protection layer IMA satisfies the aforementioned range, the visibility of the display device DD may be improved due to the high transmittance of the protection layer IMA.

The light transmittance of the protection layer IMA may be adjusted according to the content of the ionomer contained in the protection layer IMA. In the protection layer IMA according to an embodiment, the ionomer may have a content of about 1 wt % or more and about 50 wt % or less based on the total materials contained in the protection layer IMA. For example, the ionomer may have a content of about 5 wt % or more and about 30 wt % or less based on the total materials contained in the protection layer IMA. In case that less than about 1 wt % of the ionomer is contained in the protection layer IMA, the light transmittance of the protection layer IMA may decrease, and thus optical characteristics of the display device DD may be deteriorated. In case that the ionomer is contained in an amount of more than about 50 wt % relative to the total materials contained in the protection layer IMA, durability of the protection layer IMA may be deteriorated.

In an embodiment, the protection layer IMA may further include inorganic particles. The inorganic particles may be provided by being dispersed in the polymer resin impregnated into the pores defined in the base layer BF. In an embodiment, the inorganic particles may include at least one of $SiO_2$, $TiO_2$, and/or $Al_2O_3$.

In the display device DD according to an embodiment, the light transmittance of the protection layer IMA may be improved as the protection layer IMA includes the polymer resin impregnated into the base layer BF having the porous structure. In the display device DD according to an embodiment, as the polymer resin is impregnated into the base layer BF having the relatively low light transmittance, the transparency of the protection layer IMA may be ensured, and thus, the optical properties of the display device DD (see FIG. 1A) may be improved. In case that the polymer resin is impregnated into the base layer BF, the pores defined in the base layer BF may be filled with the polymer resin, and thus, effects such as reflection and refraction of light due to the porous structure may be reduced, and thus, the protection layer IMA may have high light transmittance. For example, as the polymer resin is impregnated into the base layer BF, the protection layer IMA may exhibit/have excellent mechanical durability and folding reliability. For example, the protection layer IMA may exhibit/have the high flexibility characteristics in which the internal resistance of the device does not increase in case that external stress is applied, and the display module DM (see FIG. 6A) may be prevented from being damaged by the external impact due to the improved mechanical strength.

Figure 8B:
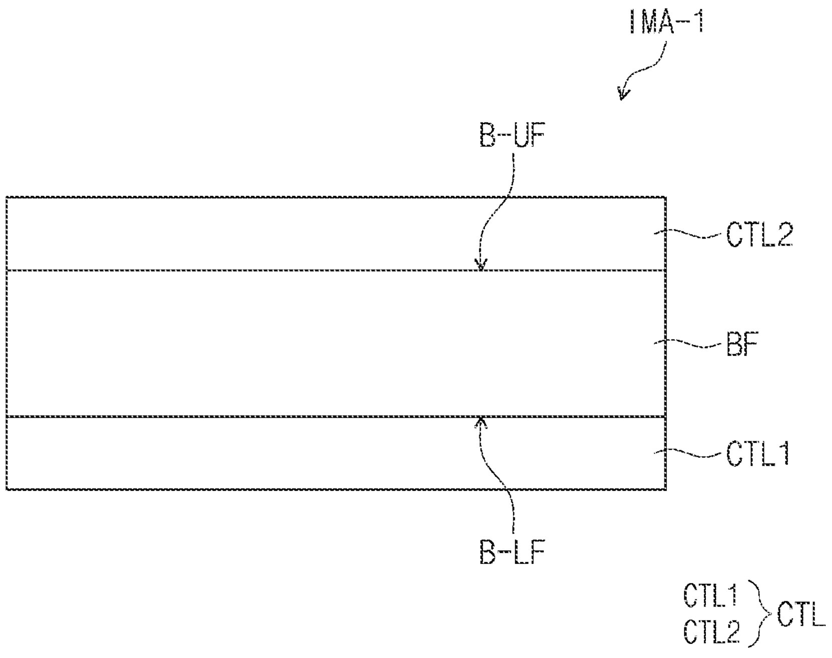

FIG. 8B is a schematic cross-sectional view of the display device according to an embodiment. A protection layer IMA-1 illustrated in FIG. 8B may be the protection layers IMA and IMA-U according to an embodiment, which is illustrated in FIGS. 6A, 6B, and 7A to 7C. The protection layer IMA-1 illustrated in FIG. 8B may be used as the protection layers IMA and IMA-U of the display devices DD, DD-1, and DD-2 according to an embodiment, which is described with reference to FIGS. FIGS. 6A, 6B, and 7A to 7C. For example, the protection layer IMA-1 according to an embodiment illustrated in FIG. 8B may be used as the additional protection layer IMA-a of the display device DD-2 according to an embodiment described with reference to FIG. 7C. Hereinafter, in describing the protection layer IMA-1 according to an embodiment with reference to FIG. 8B, the same contents as those described above will be omitted with reference to FIG. 8A and the like, and differences will be described in detail.

The protection layer IMA-1 may further include a coating layer CTL disposed on at least one surface of the base layer BF. The base layer BF may include a top surface (or upper surface) B-UF and a bottom surface (or lower surface) B-LF facing the top surface (or upper surface) B-UF of the base layer BF in the third direction DR3. The bottom surface (or lower surface) B-LF of the base layer BF may be disposed adjacent to the display panel DP (see FIG. 5). The coating layer CTL may be disposed on at least one of the top surface (or upper surface) B-UF of the base layer BF and/or the bottom surface (or lower surface) B-LF of the base layer BF. For example, as illustrated in FIG. 8B, the coating layer CTL may be disposed on the top surface (or upper surface) B-UF of the base layer BF and the bottom surface (or lower surface) B-LF of the base layer BF. However, embodiments are not limited thereto, and unlike that illustrated in FIG. 8B, the coating layer CTL may be disposed only on the top surface (or upper surface) B-UF of the base layer BF, or the coating layer CTL may be disposed only on the bottom surface (or lower surface) B-LF of the base layer BF.

Referring to FIG. 8B, the protection layer IMA-1 may include a first coating layer CTL1 disposed on the bottom surface (or lower surface) B-LF of the base layer BF and a second coating layer CTL2 disposed on the top surface (or upper surface) B-UF of the base layer BF. The first coating layer CTL1 may be disposed (e.g., directly disposed) on the bottom surface (or lower surface) B-LF of the base layer BF. The second coating layer CTL2 may be disposed (e.g., directly disposed) on the top surface (or upper surface) B-UF of the base layer BF. The base layer BF may be in contact with the top surface (or upper surface) of the first coating layer CTL1 and the bottom surface of the second coating layer CTL2, respectively. The first coating layer CTL1 may define the bottom surface (or lower surface) of the protection layer IMA-1, and the second coating layer CTL2 may define the top surface (or upper surface) of the protection layer IMA-1.

The first coating layer CTL1 may have a first thickness in the third direction DR3. The second coating layer CTL2 may have a second thickness in the third direction DR3. In an embodiment, the first thickness of the first coating layer CTL1 disposed under the base layer BF and the second thickness of the second coating layer CTL2 disposed above the base layer BF may be equal to each other. However, embodiments are not limited thereto, and the first thickness of the first coating layer CTL1 and the second thickness of the second coating layer CTL2 may be different from each other.

In an embodiment, the thickness of the base layer BF may be greater than each of the first thickness of the first coating layer CTL1 and the second thickness of the second coating layer CTL2. In case that the thickness of the base layer BF is greater than each of the first coating layer CTL1 and the second coating layer CTL2, the protection layer IMA-1 may have excellent impact resistance and improved durability. Thus, the display module DM may be prevented from being damaged by an external impact.

Each of the first thickness of the first coating layer CTL1 and the second thickness of the second coating layer CTL2 may be about 10 μm or more and about 50 μm or less. For example, each of the first coating layer CTL1 and the second coating layer CTL2 may have a thickness of about 10 μm or more and about 50 μm or less. In case that each of the first thickness and the second thickness is less than about 10 μm, the durability of the protection layer IMA-1 may be deteriorated. In case that each of the first thickness and the second thickness exceeds about 10 μm, the thickness of the protection layer IMA-1 may become thick and may not be suitable for implementing the thin display device or the foldable display device. In case that each of the first thickness of the first coating layer CTL1 and the second thickness of the second coating layer CTL2 satisfy the aforementioned range, the protection layer IMA-1 may be maintained in flexibility and may have sufficient hardness to realize excellent mechanical properties.

The coating layer CTL may include a polymer resin. The coating layer CTL may be formed by including the polymer resin. The coating layer CTL may be made of the polymer resin. Each of the first coating layer CTL1 and the second coating layer CTL2 may include the polymer resin. As for the polymer resin contained in the coating layer CTL, the same content as the polymer resin described in FIG. 8A may be applied. In the description, the polymer resin impregnated into the base layer BF may be referred to as a first polymer resin, and the polymer resin contained in the coating layer CTL may be referred to as a second polymer resin. For example, as illustrated in FIG. 8B, the polymer resin impregnated into the base layer BF may be referred to as a first polymer resin, and the polymer resin contained in the first coating layer CTL1 and the second coating layer CTL2 may be referred to as a second polymer resin. The first polymer resin and the second polymer resin may be the same as each other. The first polymer resin and the second polymer resin may be made of the same material. The first polymer resin and the second polymer resin may be provided by the same process. However, embodiments are not limited thereto, and the first polymer resin and the second polymer resin may be made of different materials according to process conditions.

In the protection layer IMA-1 according to an embodiment, the polymer resin may have a content of about 1 wt % or more and about 50 wt % or less based on the total materials contained in the protection layer IMA-1. For example, as illustrated in FIG. 8B, in case that the protection layer IMA-1 includes the coating layer CTL, the sum of the content of the first polymer resin and the content of the second polymer resin in the protection layer IMA-1 may be about 1 wt % or more and about 50 wt % or less based on the total materials contained in the protection layer IMA-1. In case that the protection layer IMA-1 contains less than about 1 wt % of the polymer resin relative to the total materials, the optical properties of the display device DD may be deteriorated due to the decrease in transmittance of the protection layer IMA-1. In case that the protection layer IMA-1 contains more than about 50 wt % of the polymer resin as compared to the total materials, the content of the polymer resin may increase as compared to the base layer BF, resulting in poor durability, and the overall thickness of the protection layer IMA-1 may increase.

In an embodiment, the protection layer IMA-1 may further include inorganic particles. For example, at least one of the base layer BF, the first coating layer CTL1, or the second coating layer CTL2 of the protection layer IMA-1 may include inorganic particles. The inorganic particles may be provided by being dispersed in the polymer resin. For example, the inorganic particles may be provided by being dispersed in the first polymer resin impregnated into the pores defined in the base layer BF or may be provided by being dispersed in the second polymer resin. In another example, the inorganic particles may be provided by being dispersed in the first polymer resin and the second polymer resin, respectively. In an embodiment, the inorganic particles may include at least one of $SiO_2$, $TiO_2$, and/or $Al_2O_3$. Hereinafter, descriptions of the inorganic particles may be applied to the configurations of the protection layers IMA-2 and IMA-3 according to an embodiment described with reference to FIGS. 8C and 8D as well as the protection layer IMA-1 according to an embodiment illustrated in FIG. 8B.

Figure 8C:
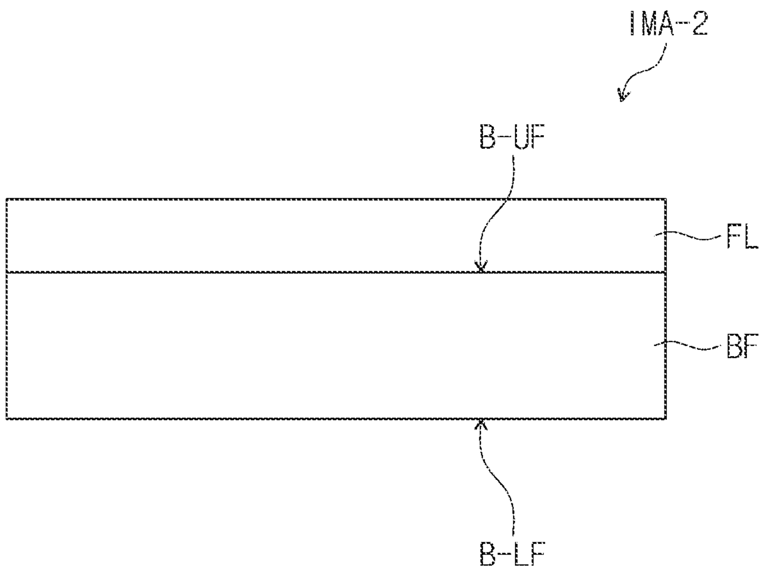
Figure 8D:
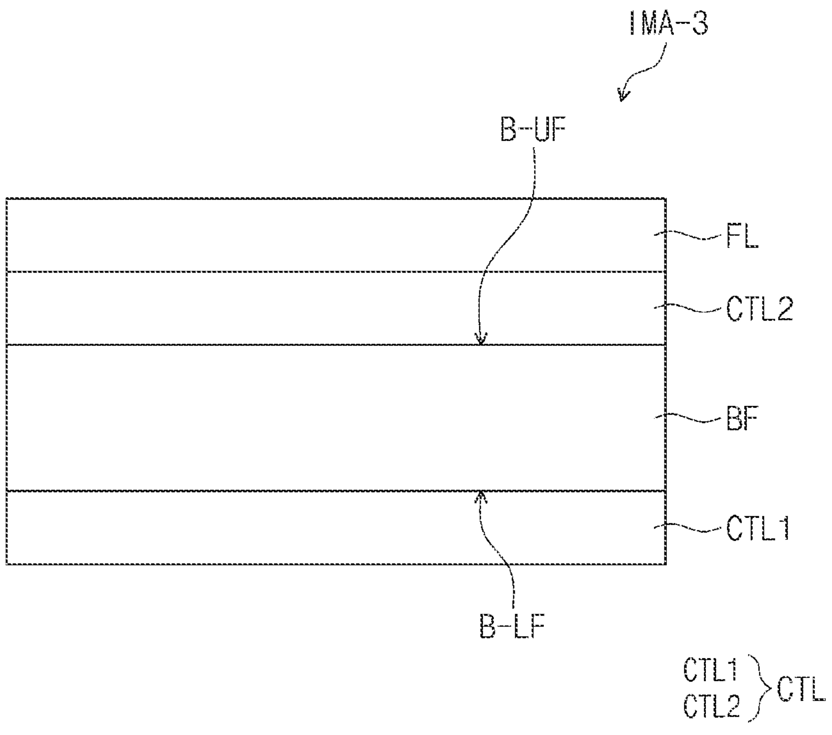

FIGS. 8C and 8D are schematic cross-sectional views of the protection layer according to an embodiment. A protection layer illustrated in FIG. 8C may be the protection layers IMA and IMA-U according to an embodiment, which is illustrated in FIGS. 6A, 6B, and 7A to 7C. Protection layers IMA-2 and IMA-3 illustrated in FIGS. 8C and 8D may be used as the protection layers IMA and IMA-U of the display devices DD, DD-1 and DD-2 according to an embodiment, which is described with reference to FIGS. FIGS. 6A, 6B, and 7A to 7C. For example, the protection layers IMA-2 and IMA-3 according to an embodiment illustrated in FIGS. 8C and 8D may be used as the additional protection layer IMA-a of the display device DD-2 according to an embodiment described with reference to FIG. 7C. Hereinafter, in describing the protection layers IMA-2 and IMA-3 according to an embodiment with reference to FIGS. 8C and 8D, the same contents as those described above will be omitted with reference to FIGS. 8A and 8B and the like, and differences will be described in detail.

Referring to FIGS. 8C and 8D, each of the protection layers IMA-2 and IMA-3 may further include a functional layer FL. For each of the components provided in the protection layers IMA-2 and IMA-3 according to an embodiment illustrated in FIGS. 8C and 8D, the description of the components illustrated in FIGS. 8A and 8B described above may be equally applied.

Referring to FIGS. 8C and 8D, the functional layer FL may include a single layer or a plurality of layers. The functional layer FL may include at least one of a hard coating layer, an anti-fingerprint layer, and/or an anti-scattering layer. However, embodiments are not limited thereto. In an embodiment, the functional layer FL may include at least one of a hard coating material and/or an anti-fingerprint material.

In case that the functional layer FL includes the hard coating layer, the hard coating layer may function to protect the window UTG (see FIG. 6A) or the display module DM (see FIG. 6A). The hard coating layer may include a hard coating material. The hard coating layer may be formed from a hard coating layer resin including at least one of an organic composition, an inorganic composition, and/or an organic-inorganic composite composition. For example, the hard coating material forming the hard coating layer may include at least one of an acrylate-based compound, a siloxane compound, and/or a silsesquioxane compound. For example, the hard coating material may further include inorganic particles. The hard coating layer may be an organic layer, an inorganic layer, or an organic/inorganic composite material layer.

In case that the functional layer FL includes the anti-fingerprint layer, the anti-fingerprint layer may function to improve stain resistance of the protection layers IMA-2 and IMA-3. The anti-fingerprint layer may include an anti-fingerprint material. The anti-fingerprint material may include a water repellent material or an oil repellent material. For example, the anti-fingerprint material may include a fluorine-based material. The fluorine-based material may include at least one of polytetra fluoroethylene (PTFE), polyvinylidenphoride (PVDF), or amorphous fluorine (Teflon AF, Cytop, etc.).

In the protection layers IMA-2 and IMA-3 according to an embodiment, the functional layer FL may have a thickness of about 1 μm or more and about 50 μm or less. For example, the functional layer FL may have a thickness of about 3 μm or more and about 30 μm or less. In case that the thickness of the functional layer FL is less than about 1 μm, the function of protecting the window UTG or the display module DM may be deteriorated, and thus the durability of the display device DD (see FIG. 1A) may be deteriorated. For example, in case that the thickness of the functional layer FL exceeds about 50 μm, the thickness of the protection layer IMA-2 may become thick, which may not be suitable for implementing the thin display device or the foldable display device. In case that the thickness of the functional layer FL satisfies the aforementioned range, the functional layer FL may simultaneously exhibit/have excellent durability characteristics. Thus, the protection layer IMA-2 including the functional layer FL may have excellent hardness, may maintain flexibility, and may exhibit improved mechanical properties.

Referring to FIG. 8C, the protection layer IMA-2 may further include a functional layer FL disposed on the base layer BF. The protection layer IMA-2 illustrated in FIG. 8C is different from the protection layer IMA illustrated in FIG. 8A in that the protection layer IMA-2 further includes the functional layer FL. The functional layer FL may be disposed on the base layer BF. The functional layer FL may be disposed on the top surface (or upper surface) B-UF of the base layer BF closer to the display surface DS (see FIG. 1A) exposed to the outside. The functional layer FL may be disposed on the outermost side of the protection layer IMA-2. The functional layer FL may be disposed (e.g., directly disposed) on the base layer BF. However, embodiments are not limited thereto, and an additional adhesive layer may be further disposed between the functional layer FL and the base layer BF.

Referring to FIG. 8D, the functional layer FL may be disposed on the second coating layer CTL2. The functional layer FL may be disposed to be spaced apart from the base layer BF with the second coating layer CTL2 therebetween. The functional layer FL may be disposed on the base layer BF. The functional layer FL may be disposed on a surface of the base layer BF closer to the display surface DS (see FIG. 1A) exposed to the outside. The functional layer FL may be disposed on the outermost side of the protection layer IMA-3. The functional layer FL may be disposed (e.g., directly disposed) on the second coating layer CTL2. However, embodiments are not limited thereto, and an additional adhesive layer may be further disposed between the functional layer FL and the second coating layer CTL2.

As illustrated in FIG. 8D, in case that the protection layer IMA-3 further includes the functional layer FL disposed on the second coating layer CTL2, the first thickness of the first coating layer CTL1 and the second thickness of the second coating layers CTL2 may be different from each other. In an embodiment, the second thickness of the second coating layer CTL2 may be less than the first thickness of the first coating layer CTL1. In case that the thickness of the second coating layer CTL2 is less than the thickness of the first coating layer CTL1, a recovery rate of the protection layer IMA-3 against deformation may be excellent. Since the second coating layer CTL2 is disposed on the base layer BF, greater deformation may occur in the second coating layer CTL2 during a folding or bending operation. The overall recovery rate of the protection layer IMA-3 may be improved by forming the second coating layer CTL2 to be thinner than the thickness of the first coating layer CTL1.

Figure 9B:
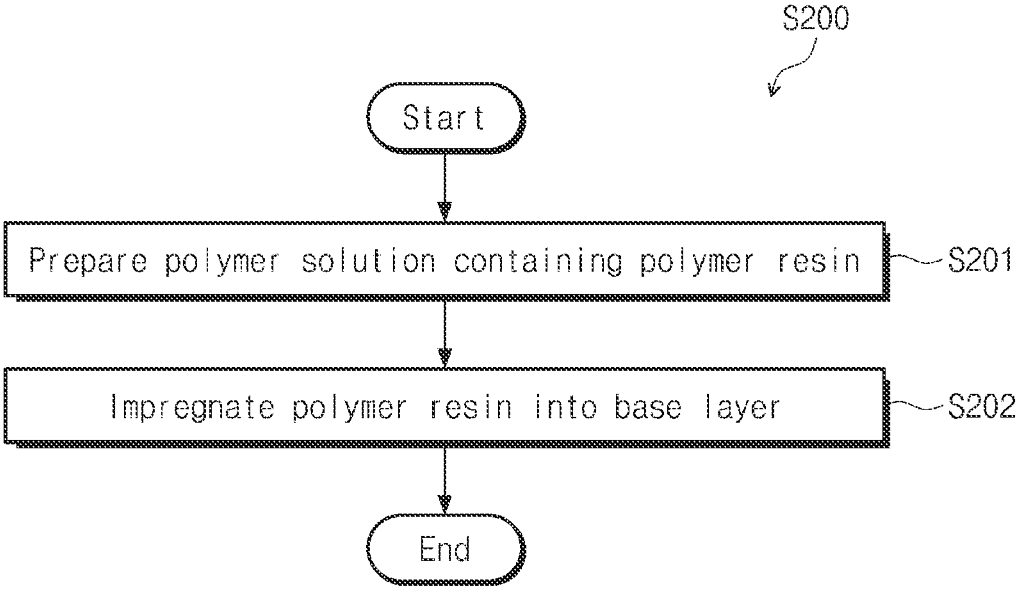
FIG. 9B is a detailed flowchart illustrating a process of forming a protection layer according to an embodiment.
Figure 10:
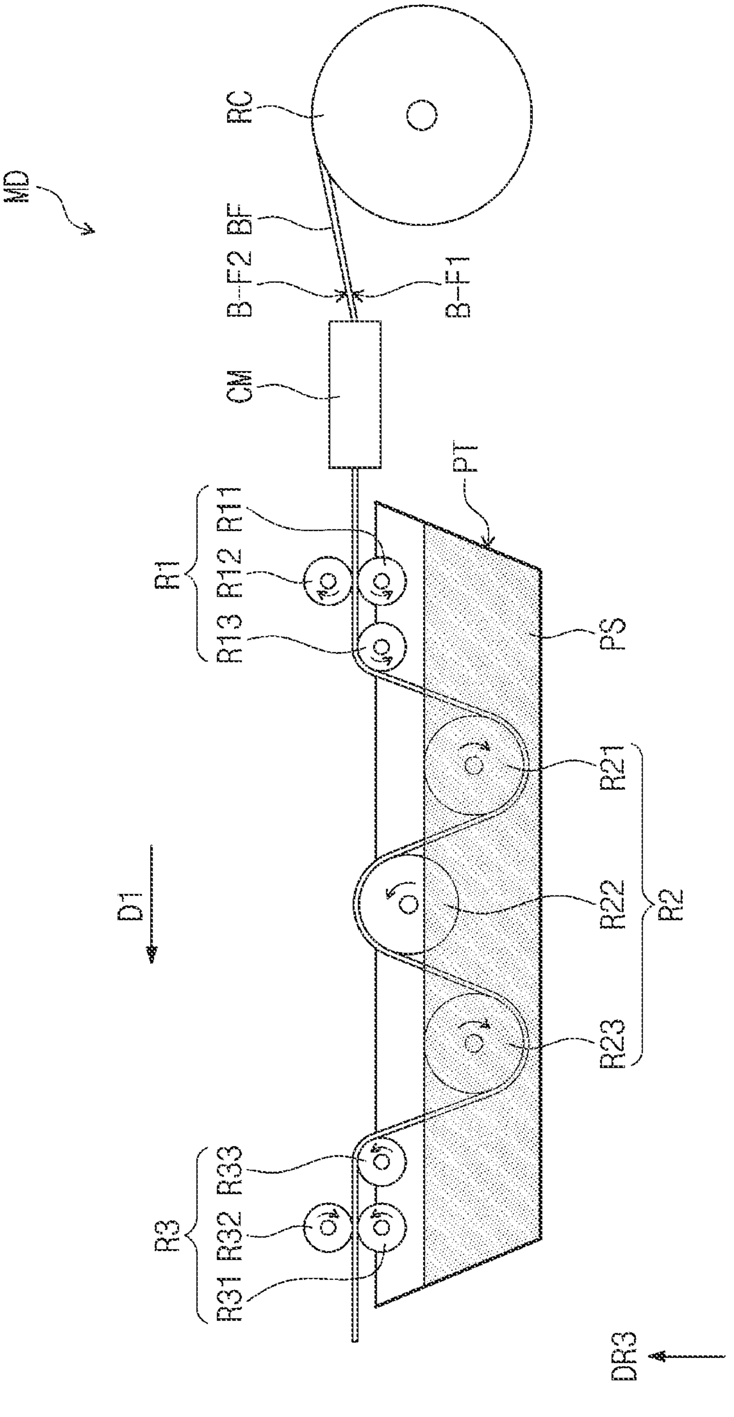
FIG. 10 is a schematic view illustrating a portion of processes in the method for manufacturing the display device according to an embodiment.

FIG. 9A is a flowchart illustrating a method for manufacturing a display device according to an embodiment. FIG. 9B is a detailed flowchart illustrating a process of forming a protection layer according to an embodiment. FIG. 10 is a schematic view illustrating a portion of processes in the method for manufacturing the display device according to an embodiment. FIG. 10 schematically illustrates an impregnation device MD used in a roll-to-roll process. Hereinafter, in describing the method of manufacturing the display device according to an embodiment with reference to FIGS. 9A, 9B, and 10, the same reference numerals are assigned to components that are identical to those described above, and detailed descriptions thereof are omitted for descriptive convenience.

Referring to FIG. 9A, the method for manufacturing the display device according to an embodiment may include a process (S100) of forming a display panel and a process (S200) of forming a protection layer.

The display panel may be the display panel DP described with reference to FIG. 5. The display panel may have a laminated structure illustrated in FIG. 5. For example, the process of forming the display panel may include a process of applying a base material on a carrier substrate to form a base substrate BL (see FIG. 5). For example, the base material may include at least one of a polyimide-based resin, an acrylate-based resin, a methacrylate-based resin, a polyisoprene-based resin, a vinyl-based resin, an epoxy-based resin, an urethane-based resin, a cellulose-based resin, a siloxane-based resin, a polyamide-based resin, or a perylene-based resin. In the description, the "$\alpha$"-based resin means as including a functional group of "$\alpha$". For example, the base material may include polyimide.

Referring to FIGS. 5 and 9A together, after the process of forming the base substrate BL, a circuit layer DP-CL may be formed on the base substrate BL, a light emitting element layer DP-EL may be formed on the circuit layer DP-CL, an encapsulation layer TFE covering the light emitting element layer DP-EL may be formed, an input sensor IS may be formed on the encapsulation layer TFE, and an antireflection layer ARL may be formed on the input sensor IS. Here, the above processes may be sequentially performed. After the display panel DP is formed, the display panel DP may be separated from the carrier substrate.

Referring to FIG. 9B, the process (S200) forming the protection layer may include a process (S201) of preparing a polymer solution containing a polymer resin and a process (S202) of impregnating the base layer with the polymer resin.

The process (S201) of preparing the solution containing the polymer resin may include a process of dissolving the polymer resin in a solvent. The polymer solution may be a solution in which the polymer resin is dispersed in the solvent. Thereafter, the process of impregnating the base layer with the polymer resin by immersing the base layer in the polymer solution may be performed.

Referring to FIG. 10, the process (S200) of forming the protection layer may be performed by the roll-to-roll process. The roll-to-roll process may be performed by using the impregnation device MD as illustrated in FIG. 10. The impregnation device MD may include an impregnation tank PT, a roller RC, a first driving roll R1, a second driving roll R2, a third driving roll R3, and a controller CM. The components provided in the impregnation device MD are not limited to the components described above. At least a portion of the above-described components may be omitted, and other components may be added.

The impregnation tank PT may be a container containing a polymer solution PS in which the polymer resin is dissolved. The polymer solution PS may refer to the polymer resin dissolved in the solvent. The solvent is not limited as long as the solvent dissolves the polymer resin, but may include at least one of an organic solvent or an inorganic solvent such as water. For example, the solvent may include water and an organic solvent. The organic solvent may be a polar solvent. For example, the solvent may be alcohol. The alcohol may be an aliphatic alcohol containing an alkyl chain of 1 to 20 carbon atoms. For example, the type of alcohol may include methanol, ethanol, propanol, isopropanol, ethylene glycol, propylene glycol, or diethylene glycol, and the like, but embodiments are not limited thereto. In case that a polar solvent is used as the solvent for dissolving the polymer resin, affinity between the polymer resin and the base layer may be improved so that the polymer resin may be effectively penetrated into pores defined in the base layer. Therefore, the pores defined in the base layer BF may be sufficiently filled with the polymer resin, and thus effects such as reflection and refraction of light due to the pores may be reduced, and thus, the protection layer IMA, IMA-1, IMA-2, IMA-3 (see FIGS. 8A to 8D) may have high light transmittance.

In an embodiment, the content of the polymer resin may be about 1 wt % or more and about 50 wt % or less based on the total weight of the polymer solution PS. However, embodiments are not limited thereto, and the content of the polymer resin may be adjusted according to the type of impregnated base layer BF or process conditions.

The polymer solution PS in which the polymer resin is dispersed in the solvent may be prepared, and the polymer solution PS may be provided to the impregnation tank PT. The polymer solution PS obtained by dissolving the polymer resin in the solvent may be supplied to the impregnation tank PT and may be in contact with the base layer BF in the impregnation process. The impregnation device MD may further include a storage tank for supplying the polymer solution PS to the impregnation tank PT. However, embodiments are not limited thereto.

The controller CM may include all devices capable of controlling overall devices based on input signals or stored data, such as general personal computers, electronic terminals, and mobile phones. For example, the controller CM may control to rotate at least one of the first to third driving rolls R1, R2, and R3. The controller CM may rotate at least one of the first to third driving rolls R1, R2, and R3 to transfer the base layer BF. The base layer BF may be sequentially transferred to the first driving roll R1, the second driving roll R2, and the third driving roll R3 along a traveling direction D1. The first to third driving rolls R1, R2, and R3 may rotate in various manners. The base layer BF may move in the traveling direction D1 to pass through the impregnation tank PT by the rotation of the first to third driving rolls R1, R2, and R3.

The base layer BF may be supplied from outside. The base layer BF may be provided in a state of being wound around the roller RC. The roller RC may be installed at one side of the impregnation device MD. The base layer BF before being impregnated may be provided in the state of being wound around the roller RC. The roller RC may supply the base layer BF to the impregnation tank PT. The base layer BF may have a roll shape by being wound around the roller RC and may be wound or unwound in the traveling direction D1. The base layer BF may be wound around the roller RC before the impregnation process and may be unwound in the traveling direction D1 during the impregnation process.

The base layer BF may have a porous structure, and may be formed in the form of a porous member. The base layer BF may be manufactured to have a porous structure. The base layer BF may be a fabric (or fabric member) having a woven fabric or non-woven fabric structure. Pores may be defined in the base layer BF. The base layer BF may include at least one selected from the group consisting of polypropylene, polyethylene, polytetrafluoroethylene, polyester, polyamide, cellulose, polysulfone, polyethersulfone, polyphenylene oxide, polybenzimidazole, polyimide, polyvinylidene fluoride, polymethyl methacrylate, polyacrylonitrile, and polyvinyl chloride. In an embodiment, the base layer BF may include at least one selected from the group consisting of polypropylene, polyethylene, and polytetrafluoroethylene.

The first driving roll R1 may transfer the base layer BF in the traveling direction D1. The first driving roll R1 may include sub driving rolls. The first driving roll R1 may include a first-first sub driving roll R11, a first-second sub driving roll R12, and a first-third sub driving roll R13. Each of the first-first sub driving roll R11, the first-second sub driving roll R12, and the first-third sub driving roll R13 may have a cylindrical shape.

The first-second sub driving roll R12 may be disposed on the first-first sub driving roll R11 in the third direction DR3. The first-first sub driving roll R11 and the first-second sub driving roll R12 may face each other in the third direction DR3. The first-third sub driving roll R13 may be disposed adjacent to the first-first sub driving roll R11. The base layer BF may be disposed between the first-first sub driving roll R11 and the first-second sub driving roll R12. Each of the first-first sub driving roll R11 and the first-second sub driving roll R12 may be in contact with the base layer BF.

In case that at least one of the first-first sub driving roll R11, the first-second sub driving roll R12, and the first-third sub driving roll R13 rotates, the base layer BF may be transferred in the traveling direction D1. For example, the first-first sub driving roll R11 and the first-second sub driving roll R12 may rotate in opposite directions. The first-third sub driving roll R13 and the first-first sub driving roll R11 may rotate in the same direction as each other. As illustrated in FIG. 10, the first-first sub driving roll R11 and the first-third sub driving roll R13 may rotate in a counterclockwise direction, and the first-second sub driving roll R12 may rotate in a clockwise direction. FIG. 10 illustrates a structure in which the first driving roll R1 includes three sub driving rolls, but embodiments are not limited thereto.

The second driving roll R2 may immerse the base layer BF in the polymer solution PS. For example, the second driving roll R2 may function to immerse the base layer BF in the polymer solution PS contained in the impregnation tank PT with transporting the base layer BF in the traveling direction D1. The base layer BF may be in contact with the polymer solution PS by passing through the impregnation tank PT by the second driving roll R2. The base layer BF transferred from the first driving roll R1 to the second driving roll R2 may be immersed in the polymer solution PS by passing through the impregnation tank PT. The base layer BF may include a first surface B-F1 and a second surface B-F2 opposite to the first surface B-F1. The first surface B-F1 of the base layer BF may correspond to the bottom surface (or lower surface) B-LF of the base layer BF described above, and the second surface B-F2 of the base layer BF may correspond to the top surface (or upper surface) B-UF of the above-described base layer BF. However, embodiments are not limited thereto. In case that the base layer BF passes through the impregnation tank PT, both the first surface B-F1 and the second surface B-F2 of the base layer BF may be in contact with the polymer solution PS. As both the first surface B-F1 and the second surface B-F2 of the base layer BF are immersed in the polymer solution PS, the polymer resin contained in the polymer solution PS may be uniformly impregnated into the base layer BF.

The second driving roll R2 may transfer the base layer BF in the traveling direction D1. The second driving roll R2 may include sub driving rolls. The second driving roll R2 may include a second-first sub driving roll R21, a second-second sub driving roll R22, and a second-third sub driving roll R23. Positions of the second-first sub driving roll R21 and the second-third sub driving roll R23 and a position of the second-second sub driving roll R22 may be different in the third direction DR3. As illustrated in FIG. 10, the second-second sub driving roll R22 may be disposed higher than the second-first sub driving roll R21 and the second-third sub driving roll R23 in the third direction DR3. However, the positions of the sub driving rolls R21, R22, and R23 are not limited thereto and may be variously adjusted according to the process conditions.

A time and temperature for impregnating the base layer BF with the polymer solution PS may not be limited and may be appropriately adjusted according to the process conditions.

For example, the content of the polymer resin impregnated into the base layer BF may be appropriately adjusted according to the process conditions. For example, the content of the polymer resin impregnated into the base layer BF may be adjusted by a concentration of the polymer resin contained in the polymer solution PS, the number of sub driving rolls provided in the second driving roll R2, the number of times of impregnation of the base layer BF into the polymer solution PS. However, embodiments are not limited thereto.

The third driving roll R3 may be disposed to face the first driving roll R1 in the traveling direction D1. The third driving roll R3 may transfer the base layer BF in the traveling direction D1. The base layer BF passing through the impregnation tank PT may be transported to the outside by the third driving roll R3 and then collected.

The third driving roll R3 may include sub driving rolls. The third driving roll R3 may include a third-first sub driving roll R31, a third-second sub driving roll R32, and a third-third sub driving roll R33. Each of the third-first sub driving roll R31, the third-second sub driving roll R32, and the third-third sub driving roll R33 may have a cylindrical shape.

The third-second sub driving roll R32 may be disposed on the third-first sub driving roll R31 in the third direction DR3. The third-first sub driving roll R31 and the third-second sub driving roll R32 may face each other in the third direction DR3. The third-third sub driving roll R33 may be disposed adjacent to the third-first sub driving roll R31. The third-third sub driving roll R33 may be disposed adjacent to the second driving roll R2. The base layer BF may be disposed between the third-first sub driving roll R31 and the third-second sub driving roll R32. The base layer BF may be in contact with the third-first sub driving roll R31 and the third-second sub driving roll R32.

In case that at least one of the third-first sub driving roll R31 to the third-third sub driving roll R33 rotates, the impregnated base layer BF may be transferred in the traveling direction D1 and then finally collected. For example, the third-first sub driving roll R31 and the third-second sub driving roll R32 may rotate in opposite directions. The third-third sub driving roll R33 and the third-first sub driving roll R31 may rotate in the same direction. As illustrated in FIG. 10, the third-first sub driving roll R31 and the third-third sub driving roll R33 may rotate in a counterclockwise direction, and the third-second sub driving roll R32 may rotate in a clockwise direction. FIG. 10 illustratively illustrates a structure in which the third driving roll R3 includes three sub driving rolls, but embodiments are not limited thereto.

For example, the base layer BF may be collected after the impregnation process by being wound around a separate collection roller. The collection roller may be installed at the other side of the impregnation device MD. The collection roller may collect the base layer BF passing through the impregnation tank PT.

In the process of impregnating the base layer with the polymer resin, the protection layers IMA and IMA-1 having structures illustrated in FIGS. 8A and 8B may be formed. In the process of impregnating the polymer resin into the base layer BF, the protection layer IMA (see FIG. 8A) illustrated in FIG. 8A may be formed, and the polymer resin may be impregnated into at least a portion of the pores defined in the base layer BF.

In another example, the protection layer IMA-1 (see FIG. 8B) illustrated in FIG. 8B may be formed in the process of impregnating the base layer BF with the polymer resin, and the coating layer CTL (see FIG. 8B) may be formed. For example, as illustrated in FIG. 8B, the first coating layer CTL1 (see FIG. 8B) may be formed on the first surface B-F1 of the base layer BF, and the second coating layer CTL2 (see FIG. 8B) may be formed on the second surface B-F2 of the base layer BF. The coating layer CTL (see FIG. 8B) formed on at least one surface of the base layer BF may include a polymer resin. In the process of impregnating the base layer BF with the polymer resin, the concentration of the polymer resin, the number of sub driving rolls provided in the second driving roll R2, and the number of times of impregnation of the base layer BF with the polymer solution PS may be adjusted to adjust the thickness of the coating layer CTL (see FIG. 8B).

For example, a process of drying the impregnated base layer may be performed after the process of impregnating the base layer with the polymer resin. However, embodiments are not limited thereto. In the process of drying the impregnated base layer, the solvent contained in the polymer solution impregnated in the base layer BF may be vaporized, and a dried polymer resin may be disposed in the pores of the base layer BF.

For example, the protection layer manufactured by the process illustrated in FIG. 10 may be applied to the above-described display device DD (see FIG. 6A). The protection layer manufactured by the process illustrated in FIG. 10 may be disposed on the display panel manufactured in the above-described process (S100) of forming the display panel. The manufactured protection layer may be applied in the form of the protection layers IMA and IMA-1 or the additional protection layer IMA-a according to an embodiment so as to have the same arrangement structure as the display devices DD, DD-1, and DD-2 illustrated in FIGS. 7A to 7C.

The display device according to the embodiment may be provided with the protection layer including the base layer having the porous structure and the polymer resin impregnated into the base layer to exhibit/have the excellent mechanical durability and the folding characteristics.

In the method for manufacturing the display device according to the embodiment, the polymer resin may be impregnated into the base layer to provide the display device having the excellent mechanical durability and the improved folding characteristics.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display device comprising:
a display panel; and
a protection layer disposed on the display panel,
wherein the protection layer comprises:
a base layer having a porous structure; and
a polymer resin impregnated into the base layer, and
wherein the polymer resin comprises at least one of nafion, flemion, or aciplex.

2. The display device of claim 1, wherein the base layer comprises at least one of glass fibers, polypropylene, polyethylene, or polytetrafluoroethylene.

3. The display device of claim 1, wherein
the base layer includes a plurality of pores, and
the polymer resin is impregnated into at least a portion of the plurality of pores.

4. The display device of claim 1, wherein the protection layer has a thickness in a range of 10 μm to 150 μm.

5. The display device of claim 1, further comprising:
a window on the display panel,
wherein the protection layer is disposed on at least one of an upper portion of the window or between the display panel and the window.

6. The display device of claim 5, wherein
the protection layer is disposed on the window, and
the display device further comprises a first adhesive layer disposed between the protection layer and the window.

7. The display device of claim 6, further comprising:
an additional protection layer disposed between the window and the display panel.

8. The display device of claim 1, further comprising:
an antireflection layer disposed between the display panel and the protection layer.

9. The display device of claim 8, further comprising:
a second adhesive layer disposed between the antireflection layer and the protection layer, wherein
the second adhesive layer is directly disposed on the antireflection layer, and
the protection layer is directly disposed on the second adhesive layer.

10. The display device of claim 1, wherein the protection layer further comprises a coating layer disposed on a surface of the base layer and comprising a polymer resin.

11. The display device of claim 10, wherein the base layer comprises:
a lower surface adjacent to the display panel, and
an upper surface facing the lower surface, and
wherein the coating layer comprises:
a first coating layer disposed on the lower surface of the base layer; and
a second coating layer disposed on the upper surface of the base layer.

12. The display device of claim 11, wherein the first coating layer has a thickness less than a thickness of the second coating layer.

13. The display device of claim 1, wherein the protection layer has light transmittance of 90% or more.

14. The display device of claim 1, wherein a content of the polymer resin relative to the protection layer is in a range of 1 wt % to 50 wt %.

15. The display device of claim 1, further comprising:
at least one folding area that is folded with respect to a folding axis extending in a direction.

16. The display device of claim 1, wherein the protection layer further comprises a functional layer formed of at least one of a hard coating material or an anti-fingerprint material.

17. A display device comprising:
a display panel comprising:
a first non-folding area,
a second non-folding area, and
a folding area disposed between the first non-folding area and the second non-folding area; and
a protection layer disposed on the display panel,
wherein the protection layer comprises:
a base layer comprising a polymer material; and
a polymer resin, and
wherein the polymer resin comprises at least one of nafion, flemion, or aciplex.

18. A method for manufacturing a display device, the method comprising:
forming a display panel; and
forming a protection layer, wherein
the protection layer is disposed on the display panel, and
the forming of the protection layer comprises:
preparing a polymer solution including a polymer resin; and
immersing a base layer having a porous structure into the polymer solution to impregnate the polymer resin into the base layer.

19. The method of claim 18, wherein, in the impregnating of the polymer resin into the base layer, a first coating layer disposed on a surface of the base layer and a second coating layer disposed on another surface of the base layer are formed.

* * * * *